United States Patent
Cunningham et al.

(10) Patent No.: US 7,356,213 B1
(45) Date of Patent: Apr. 8, 2008

(54) TRANSPARENT SWITCH USING OPTICAL AND ELECTRICAL PROXIMITY COMMUNICATION

(75) Inventors: John E. Cunningham, San Diego, CA (US); Ashok V. Krishnamoorthy, San Diego, CA (US); Ronald Ho, Mountain View, CA (US); Robert J. Drost, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/728,843

(22) Filed: Mar. 26, 2007

Related U.S. Application Data

(60) Provisional application No. 60/786,591, filed on Mar. 28, 2006.

(51) Int. Cl.
*G02B 6/12* (2006.01)
(52) U.S. Cl. .......................................................... 385/14
(58) Field of Classification Search ............ 385/14–18, 385/24, 88, 92; 257/414, 777; 324/681; 398/180
See application file for complete search history.

(56) References Cited

U.S. PATENT DOCUMENTS

| | | | |
|---|---|---|---|
| 5,726,788 A * | 3/1998 | Fee et al. ................... | 398/180 |
| 6,987,900 B2 * | 1/2006 | Leonczuk et al. ........... | 385/16 |
| 2004/0145063 A1 * | 7/2004 | Sutherland et al. ......... | 257/777 |
| 2004/0197046 A1 * | 10/2004 | Drost et al. ................. | 385/14 |
| 2005/0285214 A1 * | 12/2005 | Krishnamoorthy et al. . | 257/414 |

* cited by examiner

*Primary Examiner*—Quyen P Leung
(74) *Attorney, Agent, or Firm*—Park, Vaughan & Fleming LLP

(57) ABSTRACT

Embodiments of a switch are described. This switch includes input ports configured to receive signals (which include data) and output ports configured to output the signals. In addition, the switch includes switching elements and a flow-control mechanism, which is configured to provide flow-control information associated with the data to the switching elements via an optical control path. These switching elements are configured to selectively couple the input ports to the output ports based on the flow-control information. Furthermore, a given switching element in the switching elements is coupled to a given input port and a given output port via electrical signal paths that are configured to use proximity communication to communicate the data.

20 Claims, 20 Drawing Sheets

TRANSPARENT SWITCH USING OPTICAL AND ELECTRICAL PROXIMITY COMMUNICATION

CROSS REFERENCE TO RELATED APPLICATIONS

This application claims priority under 35 U.S.C. section 119(e) to U.S. Provisional Application Ser. No. 60/786,591, filed on Mar. 28, 2006, the contents of which are herein incorporated by reference.

This application was filed by Park, Vaughan & Fleming LLP, 2820 Fifth Street, Davis, Calif. 95618, United States of America, (530) 759-1660.

BACKGROUND

1. Field of the Invention

The present invention relates to techniques for communicating signals through switches. More specifically, the present invention relates to a multi-chip switch which includes semiconductor dies that communicate with each other using optical and electrical proximity communication.

2. Related Art

Many computer systems and networks include switches to selectively communicate data items between different system components. These switches often include multiple input ports and multiple output ports, which are often implemented as high-speed serial input/output (I/O) ports. In contrast with lower-speed parallel ports, these high-speed serial ports offer advantages, such as reducing overall power consumption and reducing associated port area (in terms of the number of printed circuit boards, chip packages, and/or I/O connectors). However, high-speed serial ports typically require additional circuits, including: circuits to serialize and deserialize data; circuits to encode and decode data; and circuits to recover an embedded clock. These additional circuits typically consume a significant amount of the area on an integrated circuit. Consequently, these additional circuits may partly determine the size and complexity of a chip.

Furthermore, many existing switches are based on a memory switch architecture. In this type of architecture, a switch includes a shared multiple-port memory that includes one or more logical buffers that selectively couple input ports to output ports based on a switch configuration (which may be based on header information in data packets). This type of memory-switch architecture provides sufficient memory bandwidth to ensure that the input ports can simultaneously write data into the buffer memories, thereby avoiding data collisions. Note that buffer memory is typically high-bandwidth memory that is often implemented on-chip. Therefore, the amount of buffer memory may also determine the size of a switch.

If the scale of the switch does not allow for a single-chip implementation, the switch may be partitioned among several chips with each chip providing a fraction of the aggregate switching capacity. Such multiple-chip implementations are often based on architectures that include multiple switching stages or multiple switching planes.

Unfortunately, it is often challenging to provide interconnects in a multi-chip switch with an aggregate bandwidth that is sufficient to accommodate the total bandwidth of the signals received by the switch. Consequently, interconnects in large-scale switches may be complicated and expensive. For example, existing switches that offer multiple Tb/s capability typically include multiple racks with cabling between the racks to provide interconnects that can accommodate the full bandwidth of the switch.

Therefore, multi-chip switches often have large footprints and consume significant amounts of power. Moreover, as the size of a given switch increases, it may be more difficult to control due to increased delays and latency. This, in turn, may lead to problems associated with coordinating or scheduling the data flow in the switch. The complexity and expense associated with the components used to address these problems can greatly impact the performance and reliability of multi-chip switches.

For example, flow-control techniques have been used to address the problems of delays and latency in switches. In particular, flow-control information (such as routing packets) has been used to configure switching paths in an all-electrical or an all-optical switch fabric. Note that in an all-electrical (or all-optical) switch fabric signals typically remain in the electrical (or the optical) domain and the switching is performed by all-electrical (or all-optical) devices based on electrical (or optical) flow-control information.

This configuration technique enables bandwidth and buffers to be reserved so the data experiences a reduced delay and latency as it traverses the switch. Unfortunately, it is difficult to effectively send routing packets ahead of data packets in a switch. Consequently, existing techniques have either intentionally slowed down the switch or have temporarily stored data in buffer memories. In either case, the potential improvement in data latency offered by using flow-control information is reduced and extra resources (such as power consumption and integrated-circuit area) are required.

Hence, what is needed is a method and an apparatus that facilitates switching without the problems listed above.

SUMMARY

One embodiment of the present invention provides a switch that includes input ports configured to receive signals (which include data) and output ports configured to output the signals. In addition, the switch includes switching elements and a flow-control mechanism, which is configured to provide flow-control information associated with the data to the switching elements via an optical control path. These switching elements are configured to selectively couple the input ports to the output ports based on the flow-control information. Furthermore, a given switching element in the switching elements is coupled to a given input port and a given output port via electrical signal paths that are configured to use proximity communication to communicate the data.

In some embodiments, the optical control path includes an optical waveguide. (Note that the term "waveguide" can include both integrated silicon waveguides as well as non-integrated glass waveguides.)

In some embodiments, a given electrical signal path in the electrical signal paths includes a first semiconductor die and a second semiconductor die. Furthermore, proximity connectors proximate to a first surface of the first semiconductor die may be coupled to proximity connectors proximate to a second surface of the second semiconductor die. For example, the proximity connectors on the first semiconductor die may be capacitively coupled to proximity connectors on the second semiconductor die.

In some embodiments, the proximity connectors on the first semiconductor die are coupled to proximity connectors on the second semiconductor die via a bridge component. In some embodiments, the first surface and the second surface face each other. Note that the first semiconductor die and the second semiconductor die may be included in a macro-chip, which includes multiple semiconductor dies that communicate the data through electrical and/or optical proximity communication.

In some embodiments, the data includes data packets. Moreover, in some embodiments the flow-control information is based on addresses in the data packets.

In some embodiments, the switch is configured to configure the switching elements prior to routing the data through the switching elements.

In some embodiments, the flow-control mechanism is configured to determine the flow-control information based on feedback from the switching elements. Note that the feedback may be in response to a proposed routing of the data, and the feedback may be communicated to the flow-control mechanism via the optical control path.

In some embodiments, the selective coupling in the given switching element is further based on local flow-control information determined in the given switching element. This local flow-control information may be determined based on communication between the given switching element and adjacent switching elements in the switch. Furthermore, in some embodiments the given switching element is configured to convert first optical signals corresponding to the flow-control information into first electrical signals to determine the local flow-control information. Then, the given switching element is configured to convert second electrical signals corresponding to the local flow-control information into second optical signals and to communicate the second optical signals to other switching elements via the optical control path.

In some embodiments, the switch includes memory, which is configured to store a history of the flow-control information.

In some embodiments, the optical control path is configured to communicate the flow-control information using multiple sub-channels. These sub-channels may be encoded using: time-division multiple access, frequency-division multiple access, and/or code-division multiple access. For example, the flow-control information may be communicated using wavelength-division multiplexing.

In some embodiments, the switch includes a first conversion element configured to convert third optical signals corresponding to the received signals into electrical signals prior to coupling to the switching elements. Furthermore, in some embodiments the switch includes a second conversion element configured to convert the electrical signals into fourth optical signals prior to coupling to the output ports.

Another embodiment of the present invention provides a computer system that includes the switch.

Another embodiment of the present invention provides a method for switching signals. During this method, flow-control information is provided to switching elements in a switch via an optical control path. Then, the signals are selectively coupled from one or more input ports to one or more output ports of the switch using the switching elements, where the selective coupling is determined by the flow-control information. Note that the signals are communicated to and from the switching elements using electrical signal paths that are configured to use proximity communication to communicate the signals.

BRIEF DESCRIPTION OF THE FIGURES

Note that like reference numerals refer to corresponding parts throughout the drawings.

DETAILED DESCRIPTION

Figure 1A:
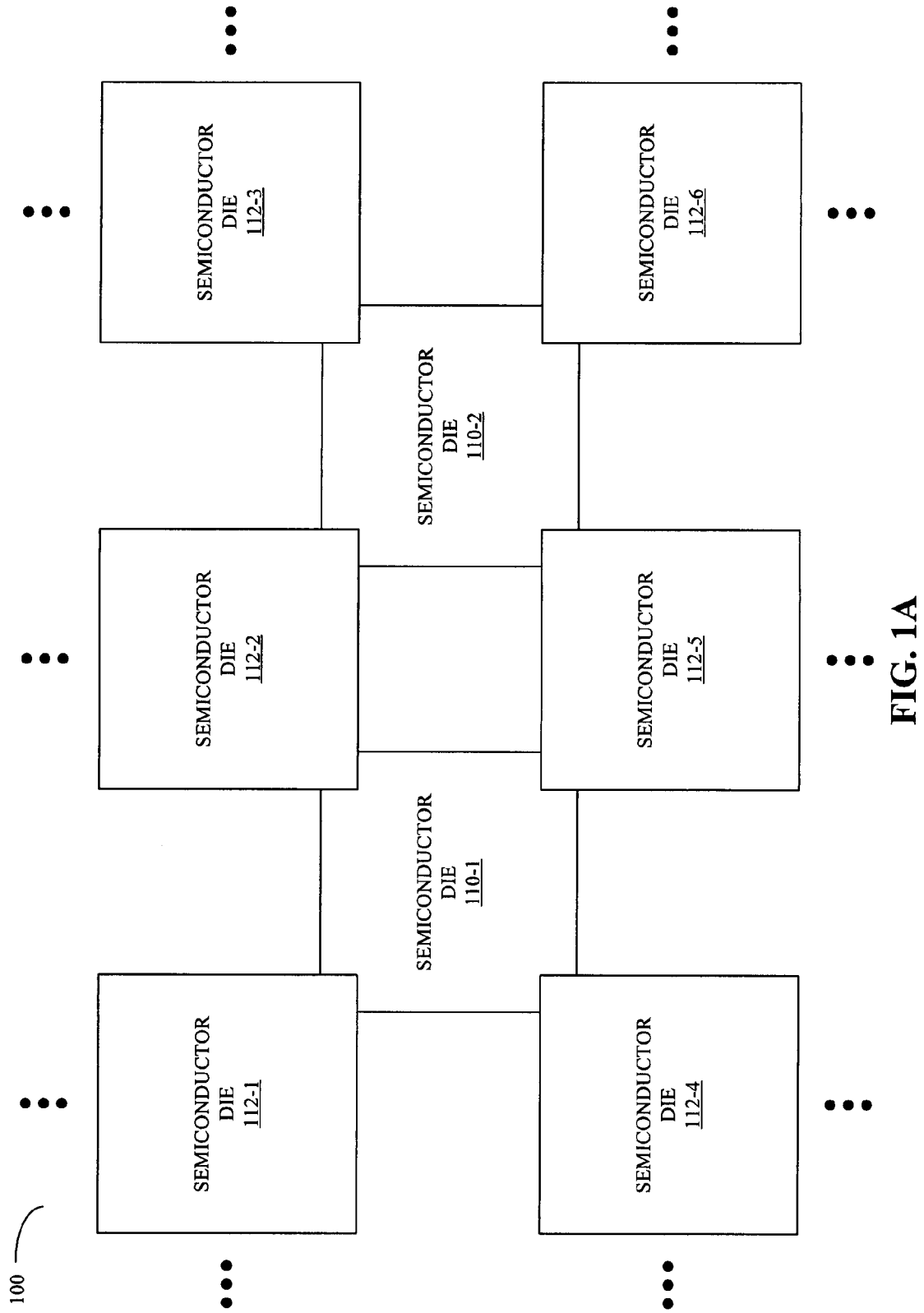
FIG. 1A is a block diagram illustrating a multi-chip module in accordance with an embodiment of the present invention.

The following description is presented to enable any person skilled in the art to make and use the invention, and is provided in the context of a parti-cular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a multi-chip module (MCM) (such as a switch), and systems that include the MCM are described. This MCM includes an array of chip modules (CMs) or single-chip modules (SCMs), and a given SCM includes at least one semiconductor die. Note that the MCM is sometimes referred to as a 'macro-chip.' Furthermore, the semiconductor die communicates with other semiconductor dies, SCMs, and/or devices in the MCM using proximity communication of electrical (capacitively coupled) signals and/or proximity communication of optical signals (which are, respectively, sometimes referred to as electrical proximity communication and optical proximity communication).

In some embodiments, a first component (such as the semiconductor die) in the MCM is situated face-to-face with another component (for example, a bridge chip or another semiconductor die) such that proximity pads or connectors on the first component are capacitively coupled and/or optically coupled with proximity pads or connectors on the other component. Note that capacitively coupled proximity connectors allow communication of electrical (capacitively coupled) signals between the components without having to route the signals through intervening signal lines within a printed circuit board. In addition, optically coupled proximity connectors allow communication of optical signals between the components without having to route the signals through a fiber-optic cable or optical interconnect.

When used in embodiments of a switch (which is considered below in illustrative embodiments of MCMs), proximity communication enables interconnects between switching elements and components in the switch to accommodate the total or full bandwidth associated with signals received by the switch. This may reduce the cost, complexity and power consumption of the switch, especially in multi-chip switch architectures. In addition, the use of proximity communication may increase integration (i.e., reduce switch size), increase reliability, and improve performance of the switch.

Note that the switch may utilize a feed-forward architecture when routing data signals from one or more input ports to one or more output ports. In particular, a flow-control mechanism in the switch may provide flow-control information (which may be based on addresses or header information associated with data packets or data units in the data signals) to one or more switching elements in the switch. Using the flow-control information, a given switching element in the switch may be pre-configured (prior to the arrival of the data signals at the given switching element) to selectively couple the data signals from at least one input port to at least one output port.

In some embodiments, flow-control information is provided via an optical control path, and in some embodiments flow-control information is provided via an electrical control path (which may include capacitively coupled or electrical proximity communication). Note that in some embodiments the optical control path includes optical proximity communication between semiconductor dies in the switch.

Furthermore, the flow-control information may also be based on feedback from one or more of the switching elements (via the optical control path and/or the electrical control path) on a proposed routing of the data signals. Moreover, the selective coupling in the given switching element may be based on local flow-control information, which is determined in the given switching element based on communication between the given switching element and one or more adjacent switching elements in the switch. For example, the local flow-control information may be based on local routing delays or contention in the switch. Thus, in some embodiments the switch includes global and/or local control of the switching elements.

By combining electrical proximity communication and optical proximity communication, the embodiments of the switch, and more generally the MCM, have reduced latency and delays because light travels at speeds 10 to 20+ times faster than those associated with wire delays. In embodiments where the flow-control information is conveyed via the optical control path, the switch may have reduced power consumption (up to 3×) because the data signals are conveyed using energy-efficient capacitively coupled signals, while only the time-sensitive flow-control information is conveyed using optical signals. However, it may be difficult to perform logic operations (such as those needed to determine the local flow-control information) on optical signals. Because conversions from the optical to the electrical domain (and vice versa) may add expense and increase power consumption, in some embodiments the flow-control information is conveyed using the electrical control path and the data is conveyed in optical signal paths that include optical proximity communication.

Embodiments of the switch may be used in a variety of applications, including: telephony, storage area networks, data centers, networks (such as local area networks), and/or computer systems (such as multi-processor computer systems). For example, the switch may be included in a backplane that is coupled to multiple processor blades, or the switch may couple different types of components (such as processors, memory, I/O devices, and/or peripheral devices). The switch may also perform the functions of a hub, a bridge, and/or a router. Consequently, in some embodiments the switch is referred to as an "intelligent hub" or a "switching hub." Furthermore, the switch may operate at one or more layers in the Open Systems Interconnection Reference Model, such as the physical layer (layer 1), the data link layer (layer 2), and/or the network layer (layer 3). Thus, in some embodiments the switch may include a multi-layer switch.

The switch may support a variety of communication protocols, including: Ethernet, IEEE 802.11 (Wi-Fi), Token Ring, Fiber Distributed Data Interface (FDDI), Point-to-Point Protocol (PPP), High-Level Data Link Control (HDLC), International Telecommunication Standardization Sector Q.921, Frame Relay, Asynchronous Transfer Mode (ATM), Fibre Channel, Infiniband, PCI Express, International Telecommunication Standardization Sector Q.931, NetBIOS Extended User Interface (NetBEUI), Transmission Control Protocol (TCP), and/or Internet Protocol (IP). Therefore, the switch may support frame or packet switching, where the data units communicated through the switch have a variable size, and/or switching protocols in which the data units have a fixed size (note that such data units are sometimes referred to as cells). Furthermore, in some embodiments the switch may support point-to-point and/or point-to-multipoint operation, as well as half-duplex and/or full-duplex operation. Note that one or more of these protocols may be implemented in the switch in hardware and/or software. Also note that signals selectively coupled by the embodiments of the switch may include analog signals, data packets, and/or data streams. Moreover, these signals may include binary symbols or encoded symbols (for example, using multiple-pulse amplitude modulation).

We now describe embodiments of a macro-chip or MCM. FIG. 1A presents a block diagram illustrating a top-view of an embodiment of a MCM 100. This MCM includes an array of multiple semiconductor dies 110 and 112. Proximity connectors on the corners (and more generally on side edges) of the semiconductor dies 110 and 112 overlap and couple signals between adjacent semiconductor dies using capacitively coupled and/or optical proximity communication. Thus, in some embodiments semiconductor dies 110 are face up and semiconductor dies 112 are face down. However, in other embodiments semiconductor dies 110 are face down and semiconductor dies 112 are face up.

In an exemplary embodiment, MCM 100 includes a computer system, including one or more processors and/or memory. In some embodiments, MCM 100 includes a switch. In these embodiments, one or more of the semiconductor dies 110 and 112 implement some or all of the functionality of a switch, such as those described below in FIGS. 7-15. Such semiconductor dies are sometimes referred to as switch chips or logic chips. Therefore, one or more of the semiconductor dies 110 and 112 may include I/O ports to communicate input signals and output signals, as well as multiple switching elements that selectively couple the input and output ports. Furthermore, in some embodiments at least one of the semiconductor dies 110 and 112 includes a flow-control mechanism or logic that provides flow-control information that configures the switching elements.

Figure 1B:
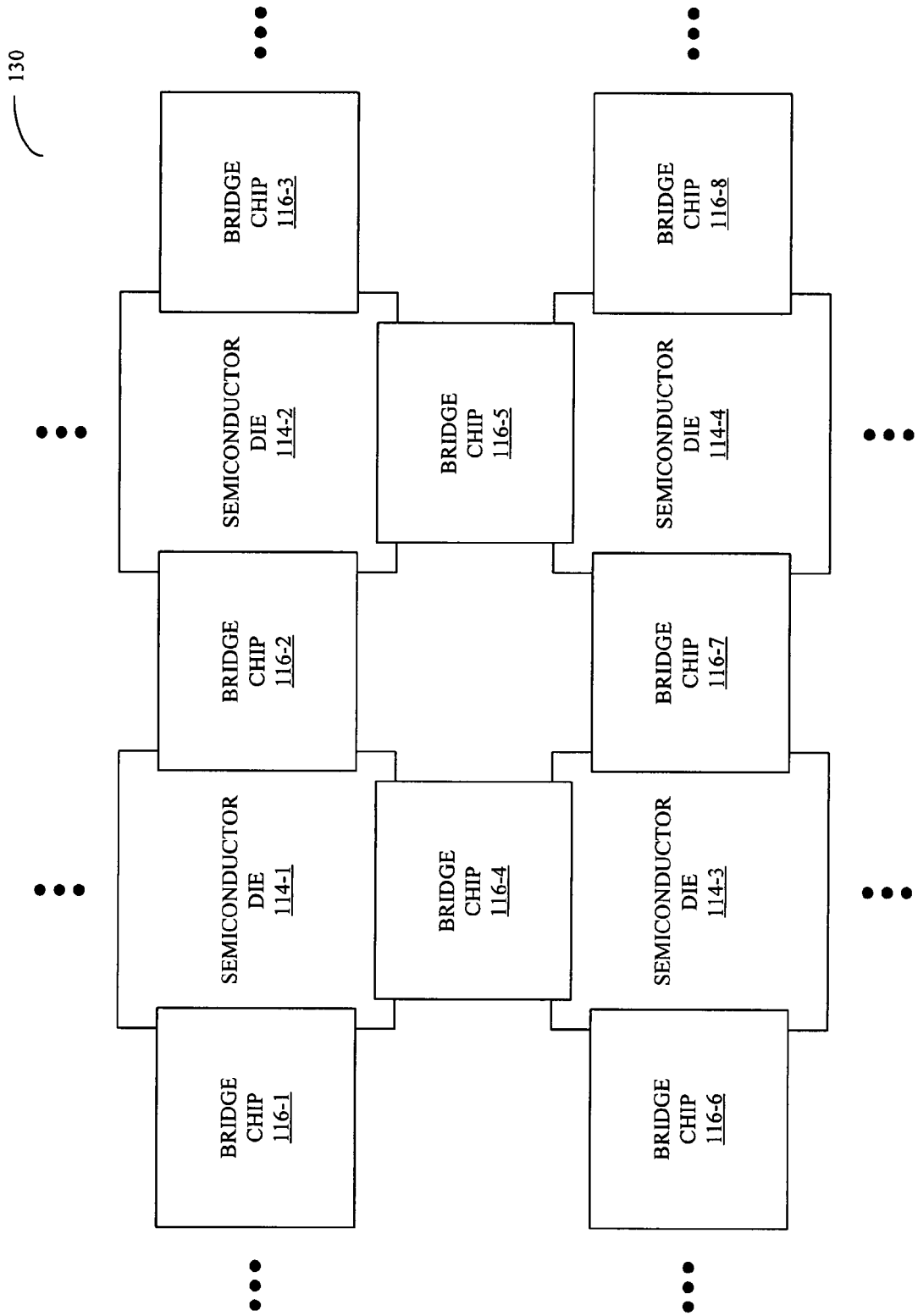
FIG. 1 is a block diagram illustrating a multi-chip module in accordance with an embodiment of the present invention.

FIG. 1B presents a block diagram illustrating a top view of an embodiment of a MCM 130 (which may include a computer system and/or a switch). This MCM includes an array of multiple semiconductor dies 114 and bridge chips 116. Proximity connectors on the side edges (and in some embodiments on the corners) of the semiconductor dies 114 and the bridge chips 116 overlap and couple signals between adjacent components in the MCM 130 using capacitively coupled and/or optical proximity communication. In some embodiments semiconductor dies 114 are face up and the bridge chips 116 are face down. However, in other embodiments semiconductor dies 114 are face down and the bridge chips 116 are face up.

Note that the bridge chips 116 may include one or more waveguides and/or multiple signal lines that couple signals from receive proximity connectors on one end of the bridge chips 116 to transmit proximity connectors on the other end. Such communication across the bridge chips 116 may be synchronous and/or asynchronous. Consequently, in some embodiments bridge chips 116 include active electronics to transmit and receive signals, to amplify signals, and/or to resynchronize phases of signals on at least two of the signal lines (for example, a pipeline circuit that includes flip flops and/or synchronization circuitry that are latched by clock signals to correct for an accumulated phase error). In these embodiments, the bridge chips 116 may be implemented using semiconductor dies, however, these dies may include different circuits and functionality than the semiconductor dies 114. In other embodiments, the bridge chips 116 are manufactured from a material other than a semiconductor.

In an exemplary embodiment, MCM 130 includes a 6×6 array of semiconductor dies 114 and a 5×5 array of bridge chips 116. In another exemplary embodiment, MCM 130 includes a 4×4 array of semiconductor dies 114 and a 3×3 array of bridge chips 116. Furthermore, electric and optical information in MCMs 100 (FIG. 1A) and 130 may flow in each of the four principle directions (North, South, East, and West) in the MCMs 100 (FIG. 1A) and 130. However, in some embodiments, electric and optical information flow along orthogonal directions in the MCMs 100 (FIG. 1A) and 130 (for example, optical information may flow East-West and electrical information may flow North-South).

Note that because of the use of proximity communication in the MCMs 100 (FIG. 1A) and 130, each of the interior components has a high-bandwidth connection to its immediate neighbors, and the bisection bandwidth of the MCMs 100 (FIG. 1A) and 130 may approach that of a single wafer-scale-integrated chip that has the same total complexity. Thus, the component-to-component bandwidth in the MCMs 100 (FIG. 1A) and 130 may be high enough to effectively hide the component boundaries and create a single 'virtual' chip.

In some embodiments, proximity communication transfers information between components in the MCMs 100 (FIG. 1A) and 130 using parallel words, thereby reducing delays. Furthermore, in some embodiments signals communicated in the MCMs 100 (FIG. 1A) and 130 are encoded (either internally or externally) using a channel code. In an exemplary embodiment, the channel code is a DC-balanced or DC-free code. For example, the channel code may be a (n, k) code, such as an 8/10 code. In some embodiments, header information in data packets or data units is not encoded. Instead, such information may be inverted and repeated to achieve DC-balance. In embodiments where MCMs 100 (FIG. 1A) and 130 include a switch, encoding and decoding of signals may or may not be implemented in the switching elements. For example, encoding and decoding may occur external to the switch or at a centralized component.

As discussed previously, in embodiments where MCMs 100 (FIG. 1A) and 130 include a switch flow-control information (such as flow control units or control flits) and data may traverse the switch in separate communication channels or signals paths. For example, in some embodiments data is communicated via optical signal paths that include optical proximity communication and flow-control information is communicated via an electrical control path, which may include capacitively coupled or electrical proximity communication. Therefore, in MCM 130 data may traverses the array in a series of hops through bridge chips 116 using optical proximity communication. As discussed below with reference to FIG. 4A, semiconductor dies 110 (FIG. 1A), 112 (FIG. 1A), and 114 and the bridge chips 116 may include one or more optical waveguides. Furthermore, as discussed below with reference to FIG. 7, switching elements in the array that define a path or routing of the data may be configured using flow-control information that is provided via an electrical control path (i.e., out-of-band control).

However, in some embodiments data is communicated in the MCMs 100 (FIG. 1A) and 130 using electrical signal paths that include capacitively coupled or electrical proximity communication and flow-control information is communicated using an optical control path (i.e., out-of-band control), which may include optical proximity communication. As discussed below with reference to FIG. 7, switching elements in the array that define a path or routing of the data may be configured using the flow-control information. Note that the optical communication may include wavelength-division multiplexing, where different sub-channels may be used to communicate flow-control information to and/or from switching elements in the MCMs 100 (FIG. 1A) and 130.

Furthermore, in some embodiments the switching elements in the MCMs 100 (FIG. 1A) and 130 include optical switching. Thus, in some embodiments the data and the flow-control information traverse the switch entirely in the optical domain. And in some embodiments, the data enters and exits the switch in the optical domain, and the data and the flow-control information traverse the switch in the electrical domain (for example, after conversion to the electrical domain as discussed below with reference to FIGS. 16 and 17).

Optical routing (in the optical control path and/or the optical signal paths) on a given component in MCMs 100 (FIG. 1A) and 130 may be accomplished using: on-chip optical waveguides (such as silicon-on-insulator waveguides), ring resonators, modulators (such as phase modulators), detectors, and/or add or drop waveguides that configure input/output ports on the given component (these waveguides may include: splitters, grating couplers, and/or combiners). To avoid crossing of waveguides on the given component, optical signals may traverse the MCMs 100 (FIG. 1A) and 130 along a first axis (such as East-West) and electrical signals (including power and ground) may traverse the MCMs 100 (FIG. 1A) and 130 along a second axis (such as North-South). This configuration may offer a compact implementation and the fast switching times associated with electric circuits. However, this assignment of directional flow is for the sake of clarity and does not in any way limit the scope of the invention disclosed here. For example, optical and electrical signals may enter and exit any side of the MCMs 100 (FIG. 1A) and 130. Furthermore, optical and electrical input/output ports may be co-positioned next to each another.

Although MCMs 100 (FIG. 1A) and 130 are illustrated as having a number of discrete items, FIGS. 1A-1B and the other embodiments described below are intended to be a functional description of the various features which may be present rather than as a structural schematic of the embodiments described herein. In practice, and as recognized by those of ordinary skill in the art, the functions of the MCMs 100 (FIG. 1A) and 130 (as well as the other embodiments) may be distributed over a large number of components performing particular subsets of functions. Therefore, the MCMs 100 (FIG. 1A) and 130 (as well as the other embodiments) may include fewer components or additional components, two or more components may be combined into a single component, and/or a position of one or more components may be changed. For example, in some embodiments bridge chips 116 may be replaced by additional semiconductor dies 114. Furthermore, in some embodiments functions of the MCMs 100 (FIG. 1A) and 130 (as well as the other embodiments) may be implemented in hardware and/or in software.

Figure 2:
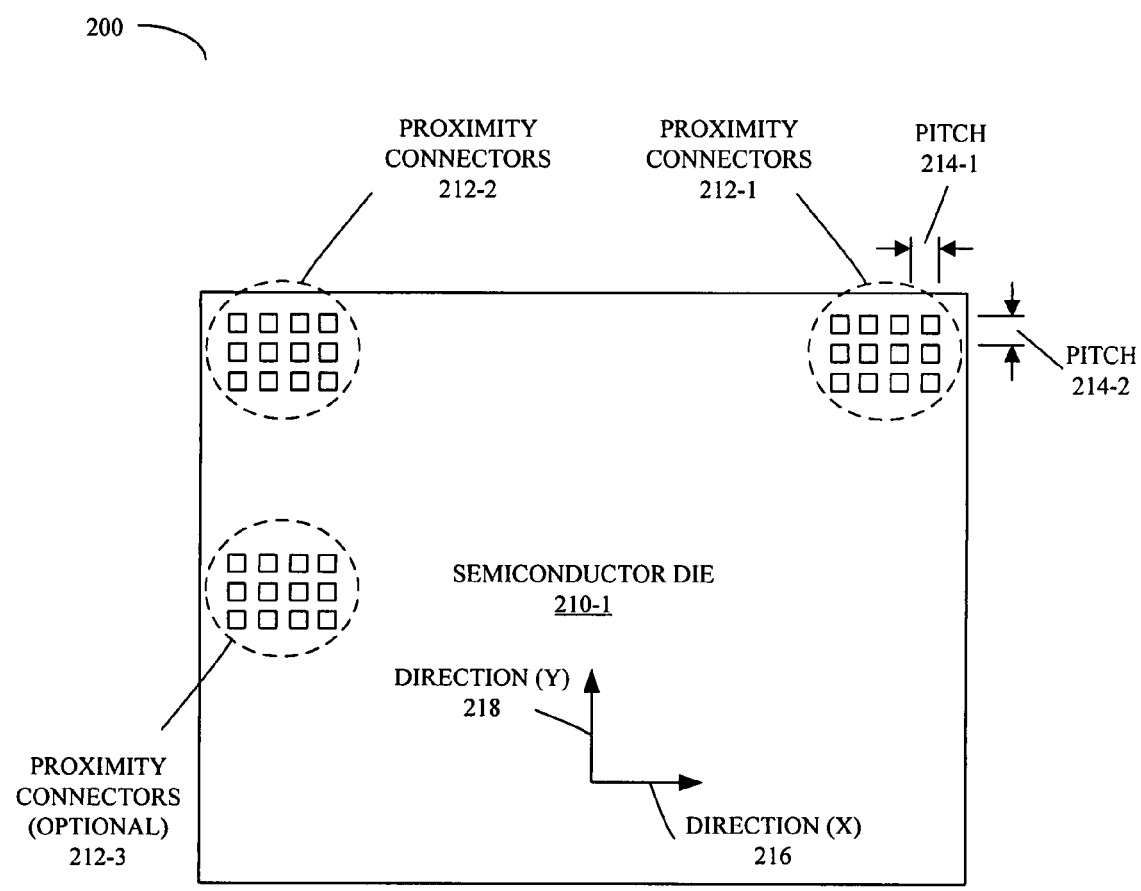
FIG. 2 is a block diagram illustrating a device that includes proximity connectors in accordance with an embodiment of the present invention.

We now described embodiments of devices (such as SCMs and MCMs) and systems that include proximity communication. FIG. 2 presents a block diagram illustrating an embodiment of a device 200 that includes proximity connectors 212 (which may be capacitive, optical, inductive, and/or conductive-based connectors). Device 200 may include at least one semiconductor die 210, where semiconductor die 210 may include integrated circuit electronics corresponding to layers deposited on a semiconductor substrate. Note that semiconductor die 210 may be packaged in an SCM and/or a MCM, where the MCM may include two or more SCMs. When packaged, for example in the SCM or the MCM, the one semiconductor die 210 is sometimes referred to as a "chip."

In one embodiment, the proximity connectors 212 may be on or proximate to at least one surface of the semiconductor die 210, the SCM and/or the MCM. In other embodiments, the semiconductor die 210, the SCM and/or the MCM may be coupled to the proximity connectors 212. In an exemplary embodiment, the plurality of proximity connectors 212 are substantially located at or near one or more corners (proximity connectors 212-1 and 212-2) and/or edges (proximity connectors 212-3) of the semiconductor die 210. In other embodiments, proximity connectors 212 may be situated at one or more arbitrary locations on, or proximate to, the surface of the semiconductor die 210.

As illustrated for the proximity connectors 212-1, there is a first pitch 214-1 between adjacent connectors or pads in a first direction (X) 216 of the surface and a second pitch 214-2 between adjacent connectors or pads in a second direction (Y) 218 of the surface. In some embodiments, the first pitch 214-1 and the second pitch 214-2 are approximately equal.

Figure 3:
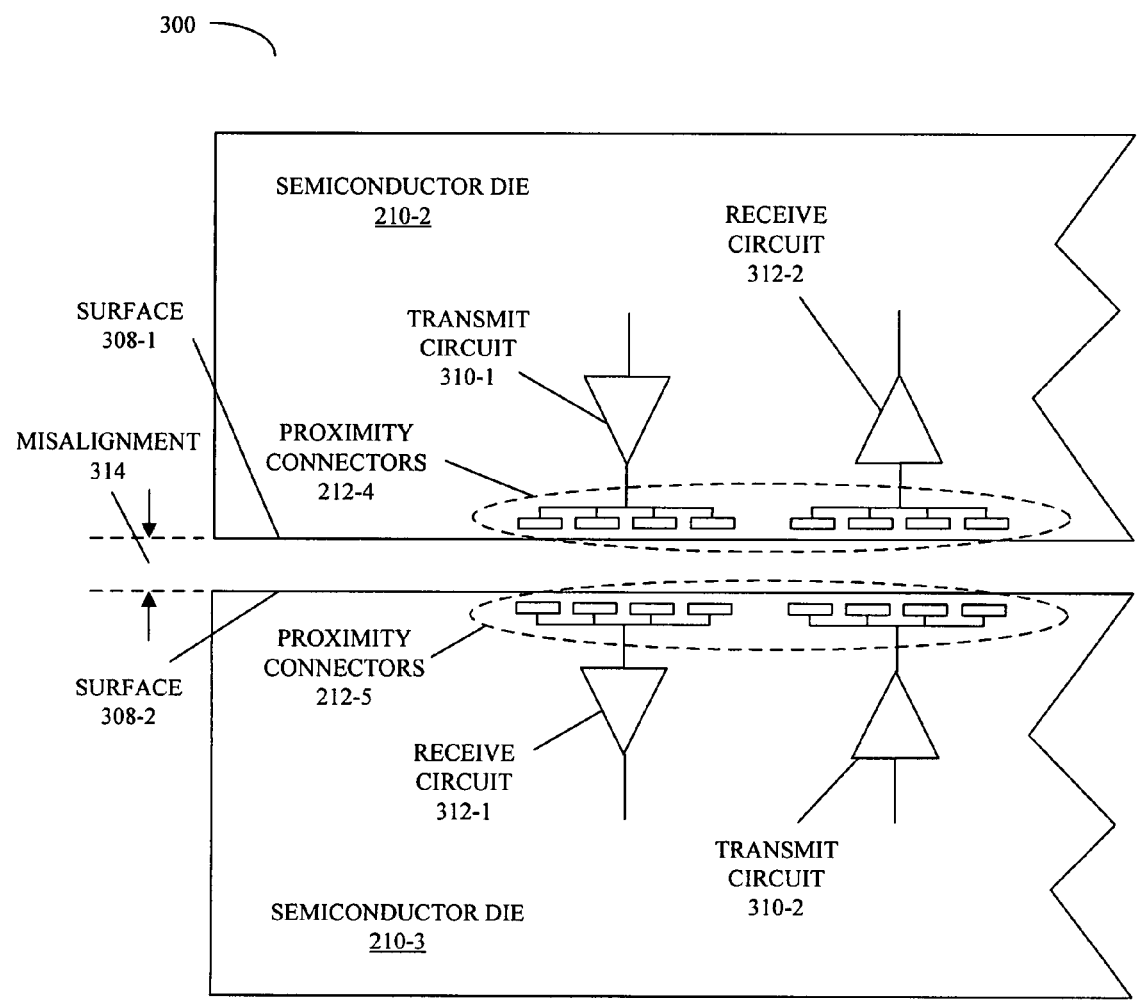
FIG. 3 is a block diagram illustrating a system that includes semiconductor dies that communicate using proximity communication in accordance with an embodiment of the present invention.

FIG. 3 presents a block diagram illustrating an embodiment of a system 300 that includes semiconductor dies 210 that communicate using capacitively coupled proximity communication (which is used as an illustration). Semiconductor dies 210 may include proximity connectors or pads 212 that are on or proximate to at least respective surfaces 308 of the semiconductor dies 210. For example, the plurality of proximity connectors 212 may be situated beneath protective layers such that they are located below the surfaces 308. Moreover, subsets of the proximity connectors 212 may be coupled to transmit circuits 310 (such as transmit drivers) and receive circuits 312 (such as receivers). One of the transmit circuits 310, at least a subset of the proximity connectors 212 on the adjacent semiconductor dies 210, and one of the receive circuits 312 may constitute a communication channel. For example, the communication channel may include transmit circuit 310-1, some of the proximity connectors 212, and receive circuit 312-1. Note that transmit circuits 310 and receive circuits 312 may utilize voltage-mode signaling (i.e., voltage-mode drivers and receivers). Furthermore, semiconductor dies 210 may also include wiring and electronics (not shown) to relay the data signals to additional electronics on the semiconductor dies 210, such as logic, memory (for example, a packet buffer memory), I/O ports, demultiplexers, multiplexers, and switching elements.

In order to communicate data signals using proximity communication, transmit and receive proximity connectors 212 on adjacent semiconductor dies 210 may have, at worst, only limited misalignment, i.e., substantially accurate alignment. For densely packed proximity connectors, i.e., proximity connectors 212 having a small spacing or pitch 214 (FIG. 2) between adjacent pads, the alignment between two or more proximity connectors 212 on adjacent semiconductor dies 210 may be within a few microns in the first direction (X) 216 (FIG. 2) and/or a few microns in the second direction (Y) 218 (FIG. 2) in a first plane including at least some of the proximity connectors 212, and/or within a few microns in a third direction (Z) approximately perpendicular to the first plane. The system 300 illustrates a misalignment 314 in the third direction (Z).

In some embodiments, the proximity connectors 212 may be aligned in six degrees of freedom, including: the first direction (X) 216 (FIG. 2); the second direction (Y) 218 (FIG. 2); the third direction (Z); an angle in the first plane defined by the first direction (X) 216 (FIG. 2) and the second direction (Y) 218 (FIG. 2); an angle in a second plane defined by the first direction (X) 216 (FIG. 2) and the third direction (Z); and an angle in a third plane defined by the second direction (Y) 218 (FIG. 2) and the third direction (Z). Note that if a surface, such as the surface 308-1, of either of the adjacent semiconductor dies 210 is non-planar (for example, due to quadrapole distortion), additional alignment problems may be introduced.

In some embodiments, allowed misalignment in the first direction (X) 216 (FIG. 2), the second direction (Y) 218 (FIG. 2) and/or the third direction (Z) is less than one half of the pitch 214 (FIG. 2) between adjacent pads 212. For example, misalignment in the first direction (X) 216 (FIG. 2) and/or the second direction (Y) 218 (FIG. 2) may be less than 25 µm, and the misalignment 314 in the third direction (Z) may be less than 5 µm.

Solutions, such as self-alignment and/or self-adjustment of relative positions of the proximity connectors 212 on adjacent semiconductor dies 210 and/or in a component (such as one of the bridge chips 116 in FIG. 1B) coupling two or more semiconductor dies 210, may reduce and/or eliminate the misalignment 314 in the third direction (Z). For example, structures that have flexibility compliance or are spring like may be used. In other embodiments, a feedback control loop may be used to reduce and/or eliminate the misalignment 314 in the third direction (Z).

Reducing or eliminating the misalignment 314, in turn, may lead to at least partial overlap of one or more proximity connectors 212 on the adjacent semiconductor dies 210 and increase a magnitude of the capacitively coupled data signals. In addition, the solutions may reduce misalignment in the first plane, i.e., the plane including at least some of the proximity connectors 212, when used in conjunction with techniques such as electronic steering (where data signals are routed to respective proximity connectors 212 based on the alignment in the first plane). Consequently, these solutions may facilitate proximity communication between the semiconductor dies 210, SCMs and/or MCMs. The solutions may also reduce and/or eliminate a need for narrow tolerances, precise manufacturing, and/or precise assembly of the semiconductor dies 210, the SCM and/or the MCM.

In the embodiments described above and below, the proximity connectors 212 on the adjacent semiconductor dies 210 utilize capacitive coupling and/or optical coupling for inter-chip communication. In other embodiments, different connectors may be overlapped on adjacent semiconductor dies 210. For example, one embodiment of the present invention uses magnetic proximity connectors, where data signals are communicated magnetically between terminals on closely adjacent semiconductor dies 210. Another embodiment couples connectors in adjacent semiconductor dies 210 using an array of solder balls.

While the device 200 (FIG. 2) and the system 300 are illustrated as having a number of components in a given configuration, in other embodiments the device 200 (FIG. 2) and/or the system 300 may include fewer components or additional components, two or more components may be combined into a single component, and/or a position of one or more components may be changed.

We now describe embodiments of optical components on semiconductor dies that may be included in the MCMs 100 (FIG. 1A) and 130 (FIG. 1B). Existing on-chip metal signal lines often result in large delays, and as technology scales, these delays are increasing. For example, as wire geometries become smaller (thinner, narrower, etc.) they become more resistive. While there are design techniques that can mitigate some of these trends in single-chip systems such as microprocessors (for example, using transistors or buffer along long wires to refresh signals), the maximum wire lengths in these systems rarely exceed 2 cm. However, in systems such as MCMs 100 (FIG. 1A) and 130 (FIG. 1B) the maximum wire length is, at least theoretically, unbounded. Consequently, the wire length may be 20 cm, and even though the resulting physical communication channel is routinely broken by proximity communication jumps between components, the latency or delay may be 10 to 20+times larger than that associated with the longest wire in a single chip.

In general, long wire latencies do not restrict the operating frequency in a system. Instead, these latencies may increase the cost of communication within the system. For example, when there are long wire latencies, memories that maintain coherency by snooping on other memories or that operate by casting out a scatter or gather request may be restricted to use a limited set of neighboring memories. In another example, architectures that pipeline communication requests may maintain queues of outstanding requests until these queues are fulfilled. Unfortunately, as communication distances and delays increase, the queues may become larger and larger, increasing the size, the power consumption, and the complexity of the system.

In some embodiments, these problems may be reduced and/or eliminated through the use of on-chip optical communication and/or capacitively coupled intra-chip communication. For example, as discussed previously semiconductor dies 110, 112, and 114 (FIGS. 1A and 1B) and/or bridge chips 116 (FIG. 1B) may include optical waveguides. These waveguides may have widths less than 1 µm and, in some embodiments, may simultaneously carry multiple independent wavelengths, thereby increasing the effective information capacity of each waveguide by the number of independent wavelengths. In an exemplary embodiments, a given waveguide may communicate 32-64 wavelengths.

Note that the speed of light in an optical waveguide is determined by the effective refractive index of the waveguide that is used to confine and communicate the light across the chip or a series of chips. In particular, the speed of light is inversely proportional to this effective refractive index and is essentially c/n, where c is the speed of light in vacuum and n is the effective refractive index of the medium. In general, n has real and imaginary components that depend on wavelength, but for many materials n is a real, non-negative number. For example, for silicon n is approximately 3.5.

In some embodiments, the effective index of a waveguide is reduced by using a so-called 'slotted' waveguide, while still strongly confining and guiding the light. Consequently, the speed of optical signal transmission in these waveguides is in the range of $1-1.8 \times 10^8$ cm/s or up to 10 times the speed of corresponding electrical signals. Furthermore, in some embodiments the delay or latency associated with the waveguides is further reduced using photonic-crystal techniques.

Figure 4A:
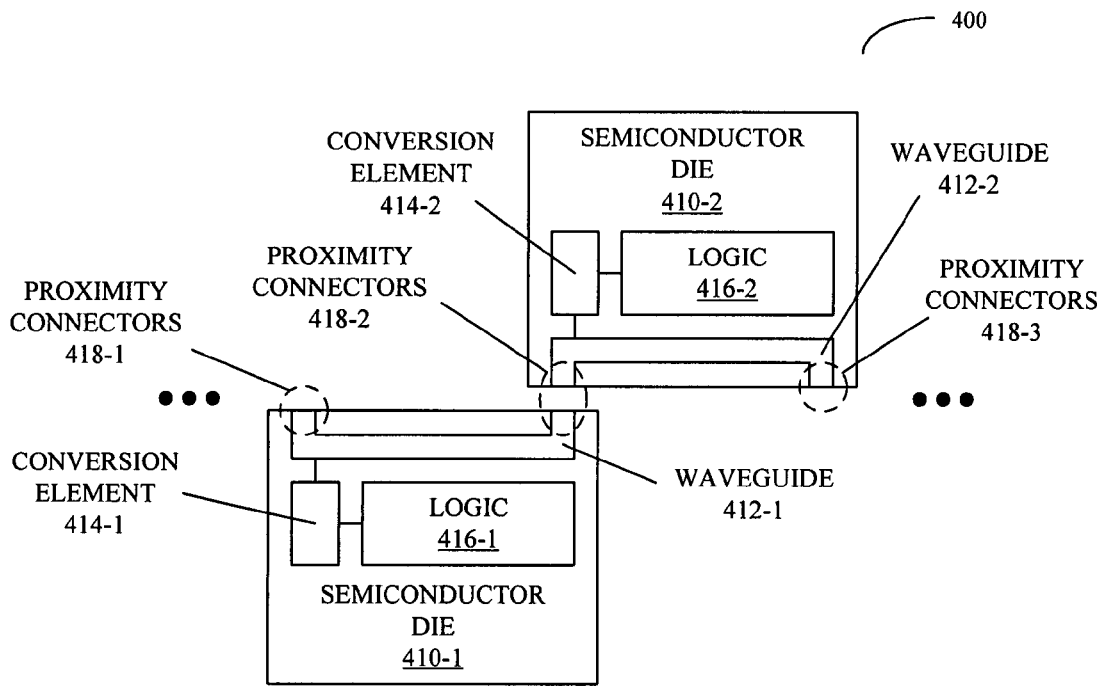
FIG. 4A is a block diagram illustrating a multi-chip module in accordance with an embodiment of the present invention.

FIG. 4A presents a block diagram illustrating an embodiment of a MCM 400. This MCM includes semiconductor dies 410, which include optical waveguides 412 and communicate using optical proximity connectors 418. For example, light may be coupled between the semiconductor dies 410 by a grating coupler embedded in the waveguides 412. Note that if the separation between adjacent semiconductor dies is less than a few microns (or a wavelength of the light) additional focusing optics between the semiconductor dies 410 may not be needed. Also note that even single-mode optical waveguides can couple signals across an air gap of these dimensions with minimal loss.

Therefore, in this embodiment proximity communication has been generalized to communication of arbitrary electromagnetic waves across the gap between the semiconductor dies 410. By increasing the frequency of the electro-magnetic waves, optical frequencies are reached, and the electromagnetic waves are none other than light. Thus, optical proximity communication may be used to communicate information between the semiconductor dies 410, and optical transmission across the semiconductor dies 410 may occur via the waveguides 412. Note that MCM 400 includes an optical signal path or optical control path that spans multiple semiconductor dies 410 without optical-to-electrical conversions or electrical-to-optical conversions at intermediate points.

As noted previously, it may be difficult to perform logical computations (such as determining local flow-control information) in the optical domain. Therefore, in some embodiments the semiconductor dies 410 include conversion elements 414, which convert optical signals to electrical signals (and vice versa). These electrical signals may be coupled to logic circuits 416, such as a local flow-control mechanism or logic that determines local flow-control information based on information from adjacent semiconductor dies 410 and/or flow-control information communicated within a switch. After determining the local flow-control information, the resulting electrical signals may be converted into optical signals using a conversion element (such as conversion element 414-1) and the optical signals may be communicated to other semiconductor dies 410. Alternatively, optical signals corresponding to flow-control information may be received and converted into electrical signals by the conversion element 414-1 prior to setting switching elements on semiconductor die 410-1. Note that the conversion elements 414 may include wavelength combiners and splitters, or may simply tap a percentage of the light as it passes by in the waveguides 412, thereby facilitating conversion from the optical to the electrical domain.

Figure 4B:
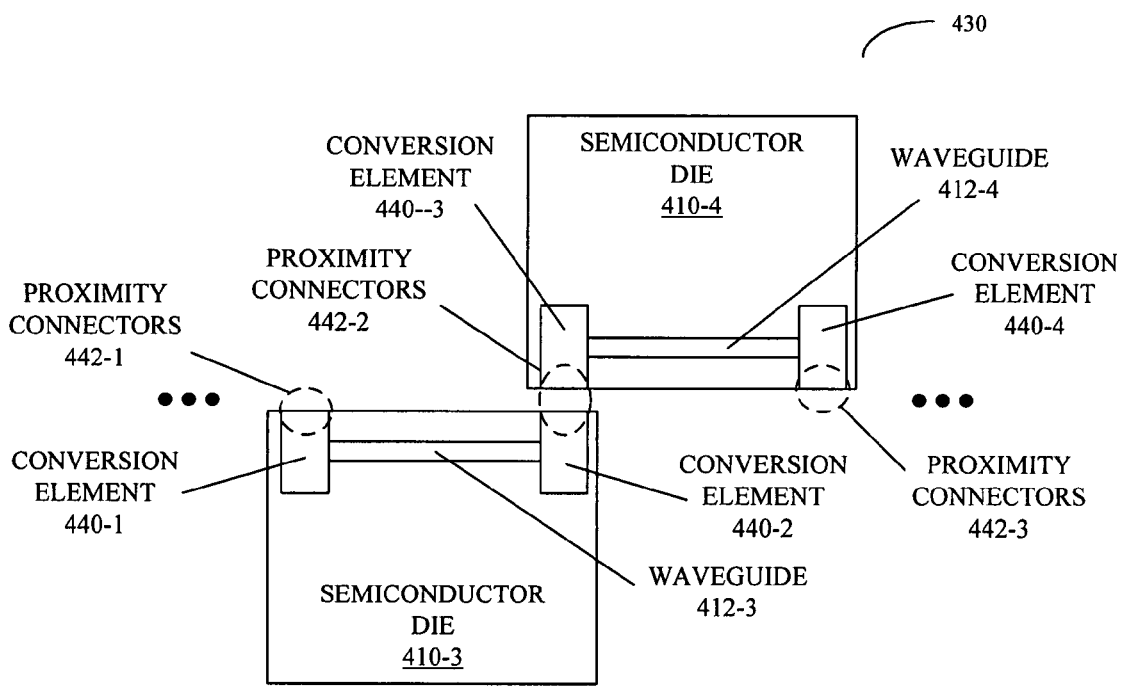
FIG. 4B is a block diagram illustrating a multi-chip module in accordance with an embodiment of the present invention.

While MCM 400 uses optical proximity communication between the semiconductor dies 410, in other embodiments electrical proximity communication is used in conjunction with on-chip optical communication. This is shown in FIG. 4B, which presents a block diagram illustrating an embodiment of a MCM 430. During transmitting, at the interface between the on-chip photonics and proximity connectors 442, the optical signals are converted to electrical signals by conversion elements 440. Similarly, during receiving, at the interface between the proximity connectors 442 and the on-chip photonics, the electrical signals are converted to optical signals by the conversion elements 440.

Note that MCM 400 and MCM 430 may include fewer components or additional components, two or more components may be combined into a single component, and/or a position of one or more components may be changed.

Figure 5:
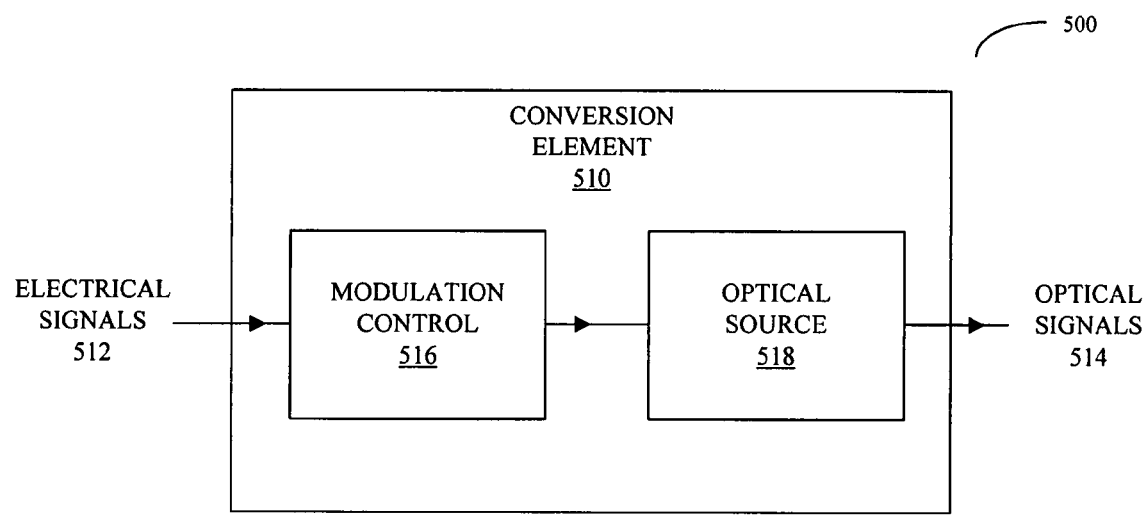
FIG. 5 is a block diagram illustrating a conversion element in accordance with an embodiment of the present invention.

FIG. 5 presents a block diagram illustrating an embodiment 500 of a conversion element 510. Modulation control 516 may modulate an optical source 518 based on electrical signals 512 to produce optical signals 514. Furthermore, while not shown, the modulation control 516 may modulate an optical source 518 based on the optical signals 514 to produce the electrical signals 512. Note that the optical source 518 may include: embedded or integrated lasers or light emitting diodes (LEDs), and/or external lasers or LEDs that are coupled to the semiconductor dies 410 (FIGS. 4B). For example, the lasers may include vertical cavity surface-emitting lasers or side-emitting lasers. In some embodiments, erbium amplifiers are used to compensate for on-chip optical losses.

Note that the conversion element 510 may include fewer components or additional components, two or more components may be combined into a single component, and/or a position of one or more components may be changed.

Figure 6A:
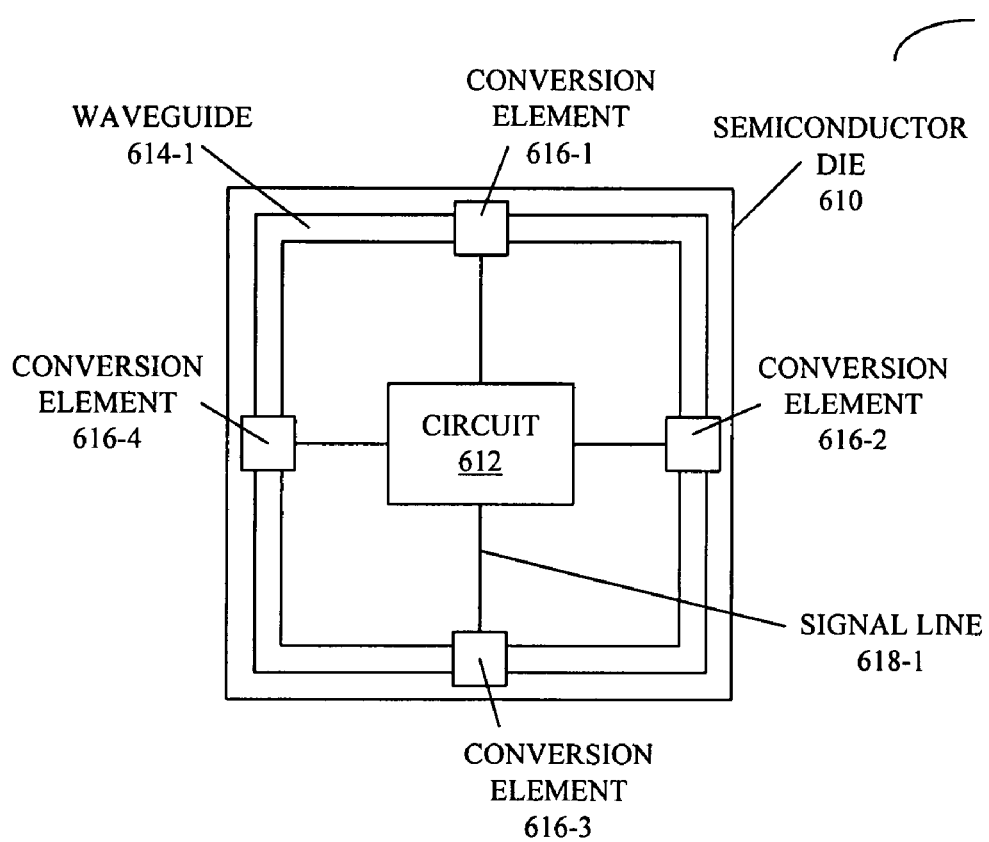
FIG. 6A is a block diagram illustrating a device that includes on-chip optical communication in accordance with an embodiment of the present invention.
Figure 6B:
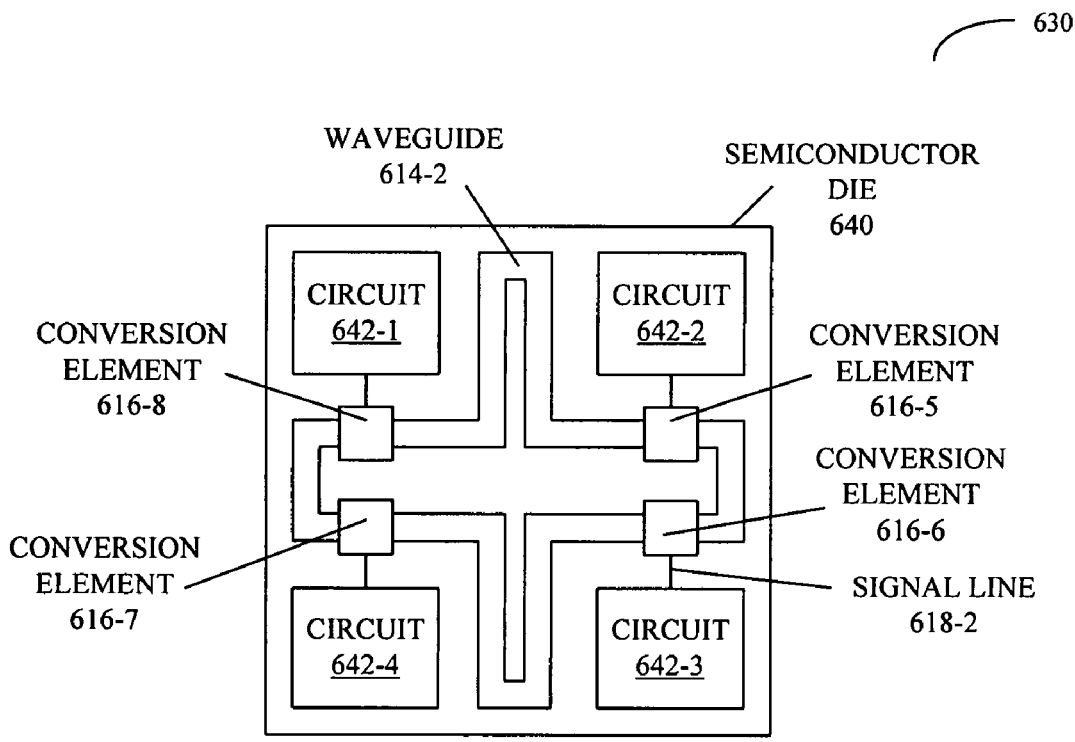
FIG. 6B is a block diagram illustrating a device that includes on-chip optical communication in accordance with an embodiment of the present invention.

FIGS. 6A and 6B present block diagrams illustrating embodiments of devices 600 and 630 that include on-chip optical communication. In these devices, the on-chip photonics include buses (such as waveguides 614) running along the edge and/or across the middle of semiconductor dies 610 and 640. Note that the communication of on-chip optical signals may includes encoding of information using: time-division multiple access, frequency-division multiple access, or code-division multiple access. For example, communication of the on-chip optical signals may use wavelength-division multiplexing to combine different frequencies into a single waveguide (such as the waveguide 614-1). However, in other embodiments there may be a single frequency per waveguide. In either case, the waveguides 614 provide a low-loss, non-radiative communication medium for signaling across the surface of the semiconductor dies 610 and 640.

Note that in addition to carrying data and/or flow-control information the semiconductor dies 610 and 640 may also include circuits 612 and 642. For example, these circuits may include a switch or a computer, including a computation core (such as a processor) and/or a storage core (such as memory). Consequently, the photonic networks on each of the semiconductor dies 610 and 640 may also interact with routing points or conversion elements 616 to convert signals from the optical domain to the electrical domain prior to coupling to the circuits 612 and 642 (via signal lines 618), and back again after processing and/or storage.

In some embodiments, the on-chip photonic networks carry one or more synchronization signals in addition to data and/or flow-control information. For example, clock signals may be communicated in a MCM (such as MCM 100 in FIG. 1A and/or MCM 130 in FIG. 1B) with as low a latency as clock signals on a single chip, thereby synchronizing the entire system.

In an exemplary embodiments, data, flow-control information, and/or clock signals are communicated on the waveguides 614 using wavelength-division-multiplexing signaling. Such signaling may be accomplished using optical multiplexers and demultiplexers that are integrated on chip using silicon-on-insulator technology. In addition, the semiconductor dies 610 and 640 may include: arrayed waveguide gratings, ring resonators, and/or Mach-Zander phase modulators.

Note that the semiconductor dies 610 and 640 may include fewer components or additional components, two or more components may be combined into a single component, and/or a position of one or more components may be changed.

We now describe embodiments of a switch for switching signals. As an illustration, in the discussion that follows flow-control information is provided via an optical control path and data is routed via electrical signal paths that include capacitively coupled proximity communication. However, in other embodiments the flow-control information is provided via an electrical control path and the data is routed via optical signal paths.

Figure 7:
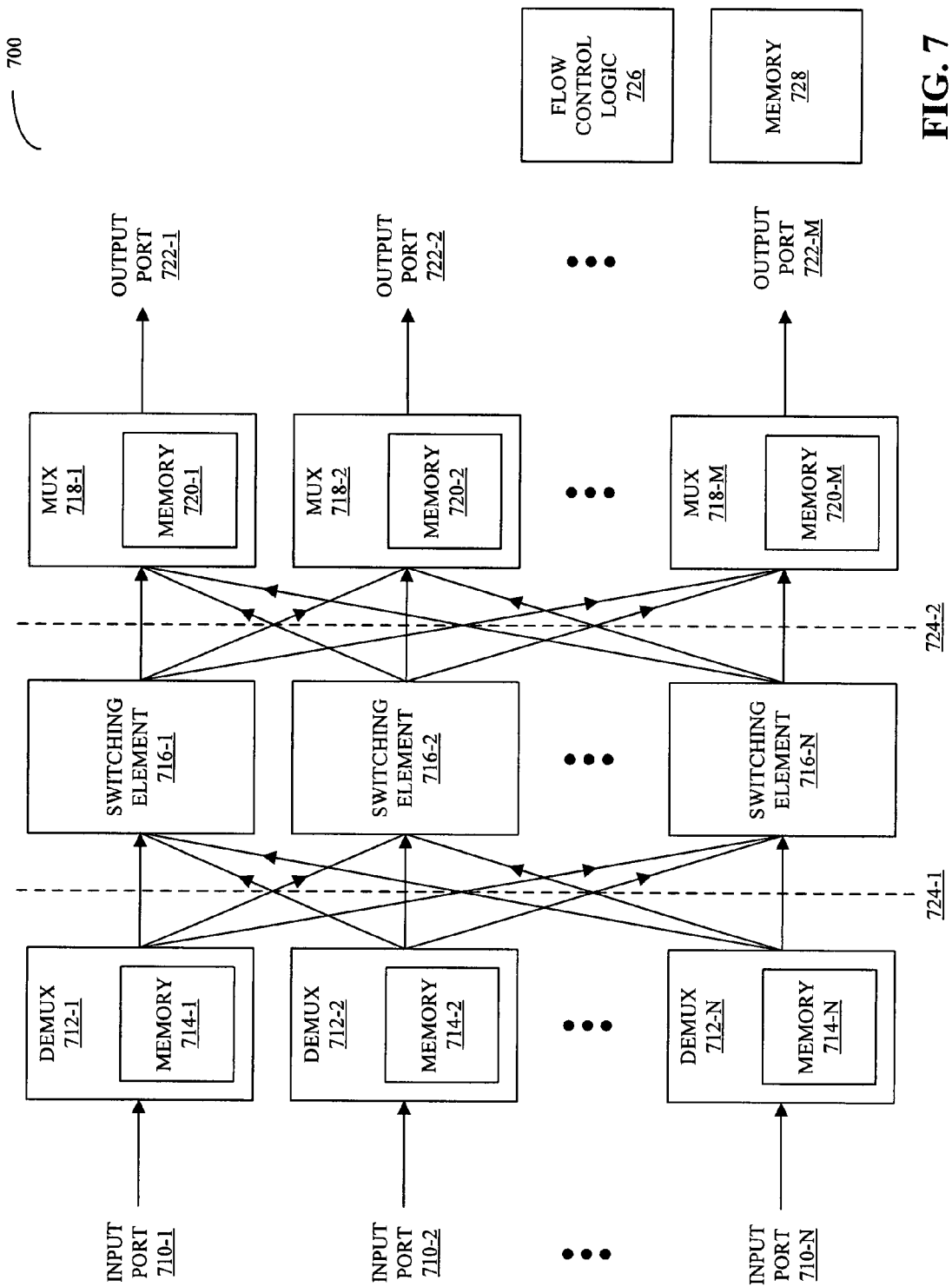
FIG. 7 is a block diagram illustrating a multi-chip switch in accordance with an embodiment of the present invention.

FIG. 7 presents a block diagram illustrating an embodiment of a multi-chip switch 700 (which may include multiple semiconductor die or SCMs). An input stage includes multiple demultiplexers (DEMUXs) 712 or routers that distribute signals (data traffic) received at N input ports 710 to a switching stage, which includes multiple switching elements 716. Data, such as a payload in a data packet (henceforth referred to as a data unit), in the signals may be sent or routed to one or more of the switching elements 716 based on flow-control information (which selects or specifies a configuration of the multi-chip switch 700) determined by flow-control mechanism or logic 726. For example, the flow-control information may be based on one or more address associated with data units, such as a Media Access Control (MAC) address (for example, IEEE EUI-48). Note that the flow-control information may be determined in either the electrical and/or the optical domain, and may be converted into another domain (such as the optical domain) prior to transmission.

In some embodiments, the flow-control information includes: status bits (such as a priority), sender information, billing information, and/or flow control units or control flits (which provide routing addresses that the switch fabric in the multi-chip switch 700 uses to guide subsequent data units or data flits through the network). Furthermore, in some embodiments the flow-control logic 726 includes a service processor or an asynchronous process (in which event-triggering, such as the arrival of a data packet, is used to determine the flow-control information).

As discussed previously, the flow-control information may be provided to components in the multi-chip switch 700 via an optical control path (not shown) that is separate from the electrical signal paths that communicate the data units (thus, the multi-chip switch 700 may utilize out-of-band control of the switching elements 716). Note that these electrical signal paths may include electrical proximity communication between chips in the multi-chip switch 700. In some embodiments, the optical control path is configured to communicate the flow-control information using multiple sub-channels. Furthermore, these sub-channels may be encoded using: time-division multiple access, frequency-division multiple access, and/or code-division multiple access. For example, the flow-control information may be communicated using wavelength-division multiplexing.

In some embodiments, the data units are sliced by the demultiplexers (DEMUXs) 712 and data subunits are sent to one or more of the switching elements 716. For example, a several kilo-byte input data stream may be split into multiple 64 byte (B) cells. However, in other embodiments slicing of the data units may occur in circuits that are external to the multi-chip switch 700, such as in a circuit board (which is sometimes referred to as a line card) that may be used with the switch.

Switching elements 716 selectively couple the signals to an output stage that includes multiple multiplexers (MUXs) 718, which collect traffic from the switch stage and forward it to M output ports 722. Once again, this selective coupling may be based on flow-control information provided by flow-control logic 726. Note that the flow-control logic 726 may be internal or external to the multi-chip switch 700. Furthermore, the flow-control logic 726 may be central or distributed. For example, the flow-control logic 726 may be distributed among the line cards, or (as discussed below) the flow-control logic 726 may be included in one or more of the switching elements 716.

Note that in some embodiments the flow-control information determined by the flow-control logic 726 is also based on feedback to a proposed routing or path of the data units from one or more components in the multi-chip switch 700. Moreover, the selective coupling in the given switching element (such as the switching element 716-1) may be based on local flow-control information, which is determined in the switching element 716-1 based on communication between the switching element 716-1 and one or more adjacent switching elements (such as switching element 716-2). For example, the local flow-control information may be based on local routing delays or contention in the multi-chip switch 700 (which is sometimes referred to as a context for a given switching element, such as switching element 716-1). Note that the local-flow information may be determined after the optical flow-control information is converted into electrical signals (as illustrated in MCM 400 in FIG. 4A). Furthermore, feedback and/or local flow-control information may be communicated in the multi-chip switch using the optical control path. In some embodiments, different sub-channels are used to communicate flow-control information to and from different components in the multi-chip switch 700.

Demultiplexers (DEMUXs) 712 may include memory 714, and multiplexers (MUXs) 718 may include memory 720. This memory, which may be dynamic and/or static, may be used to temporarily store data to avoid data collisions during communication through the multi-chip switch 700. For example, the multi-chip switch 700 may implement a forwarding process, such as Store and Forward, Cut-Through Switching, Fragment-Free Cut-Through Switching (a copyright of Intel Corporation), and/or Adaptive Switching (a copyright of Intel Corporation).

In some embodiments, the multiple multiplexers (MUXs) 718 may use memory 720 to reassemble data subunits. And in some embodiments, the multiple multiplexers (MUXs) 718 may use memory 720 to synchronize and/or re-sequence data that is received from switching elements 716. For example, data may be received in a different order than the order in which the data was provided by one or more of the demultiplexers (DEMUXs) 712. In other embodiments, however, reassembly of data subunits and/or re-sequencing occurs in circuits that are external to the multi-chip switch 700, such as in a line card.

Note that if a full or total bandwidth of the signals received on the input ports 710 is b, a bandwidth of an internal link (such as between demultiplexer (DEMUX) 712-1 and switching element 716-1) in the multi-chip switch 700 is b/N in order for data flow in the switch 700 to keep pace with data received at the input ports 710. However, an aggregate bandwidth at bisecting planes 724 is b (this bandwidth is sometimes referred to as a bisection bandwidth). As discussed previously, it may be difficult to achieve these bandwidths using existing interconnects. However, interconnects that include proximity communication (such as electrical proximity communication) may have significantly larger bandwidths for communicating the data units. For example, by using interconnects that include proximity communication each switching element and/or each semiconductor die or chip in a given switch may have the same bandwidth as the switch as a whole (i.e., the bisection bandwidth). This may allow multi-chip switches that are cheaper, less complex, and that have improved performance. Embodiments of a multi-chip switch that includes proximity communication are described further below with reference to FIGS. 10-15.

Multi-chip switch 700 may include fewer components or additional components. For example, the multi-chip switch 700 (as well as the other multi-chip switch embodiments described below) may include one or more additional switching stages (such as the fat-tree network described below in FIG. 9), or the control logic 726 may include a scheduler that manages data flow in the switch. In some embodiments, the multi-chip switch 700 includes memory 728, which may be configured to store a history of the flow-control information. This memory may facilitate copying or rotating flow-control information (such as control flits) back into the data units so that a permanent record of the control flits is maintained. However, in other embodiments the flow-control information is consumed as it is used in the multi-chip switch 700, and the data units and any unused control flits exit the switch at the correct output port(s) 722.

Furthermore, two or more components may be combined into a single component, and the position of one or more components may be changed. In some embodiments, portions of the multi-chip switch 700 are integrated onto a single chip. Thus, in some embodiments a single chip includes multiple switching elements 716 and these switching elements are configured based on flow-control information provided via an optical control path on this chip.

Figure 8:
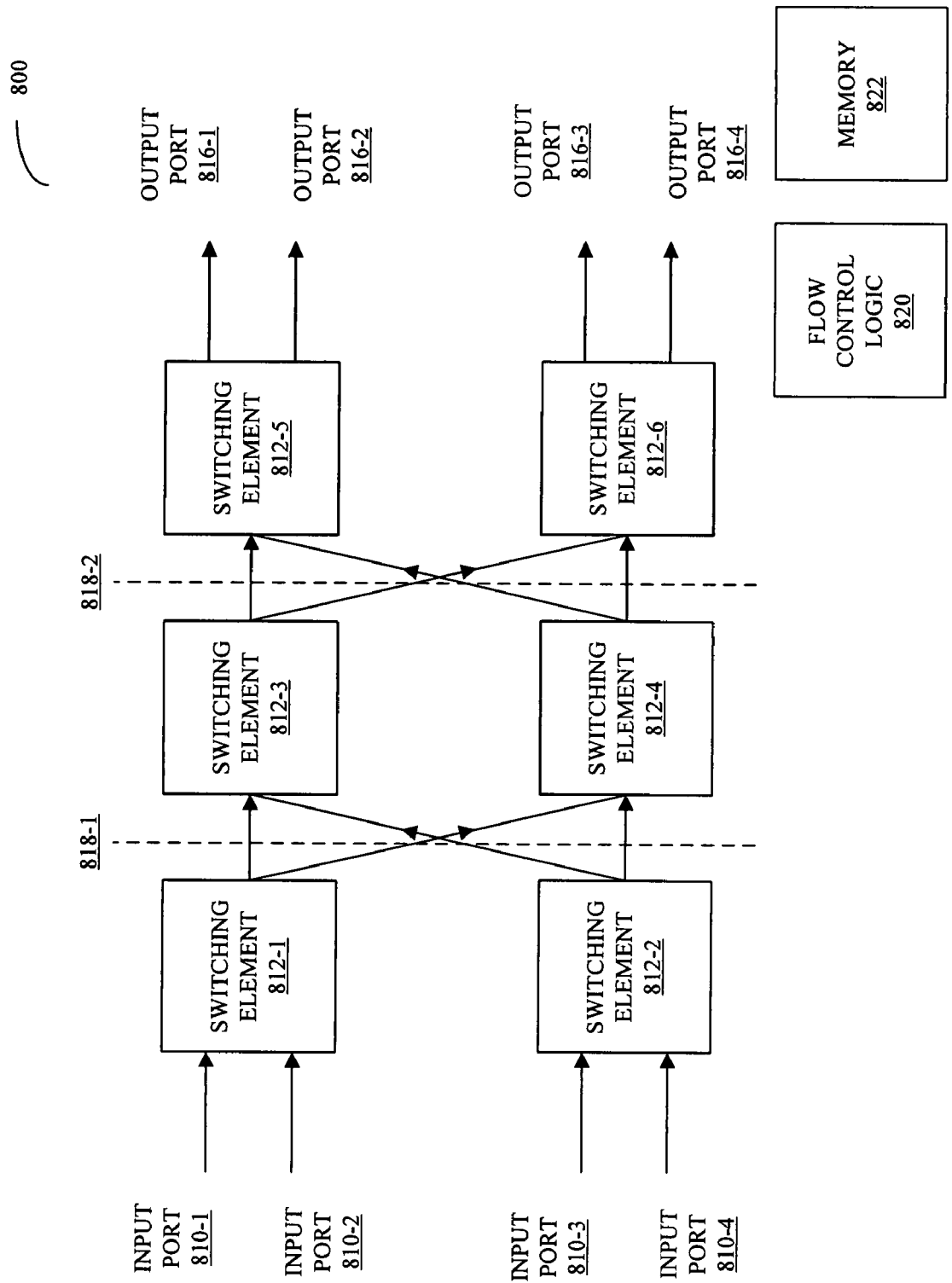
FIG. 8 is a block diagram illustrating a multi-chip switch in accordance with an embodiment of the present invention.
Figure 9:
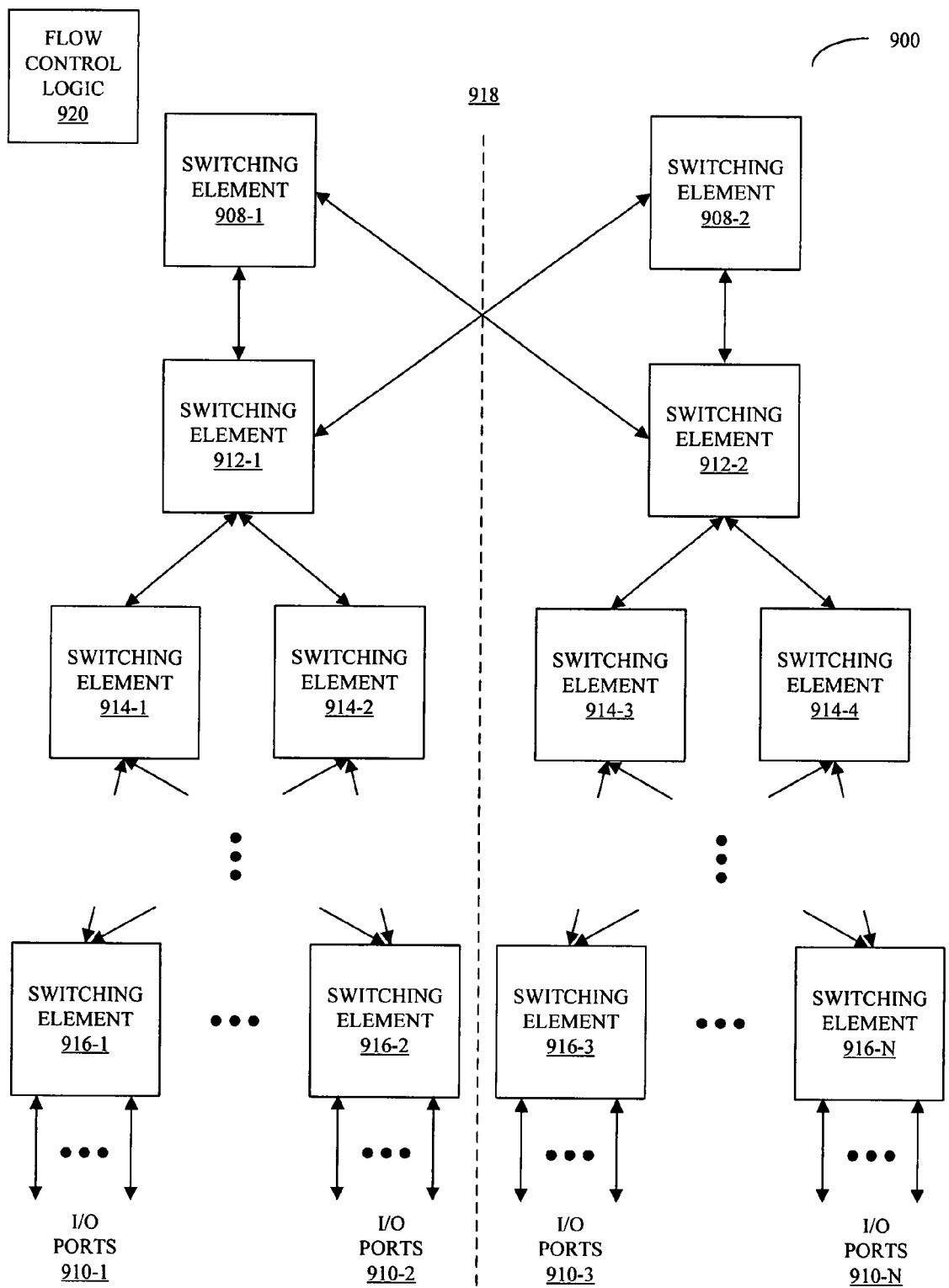
FIG. 9 is a block diagram illustrating a multi-chip switch in accordance with an embodiment of the present invention.

Larger switches may be implemented by assembling smaller groups of switching elements, such as the switching elements 716, in a hierarchical fashion. This is illustrated in FIGS. 8 and 9. FIG. 8 presents a block diagram illustrating an embodiment of a multi-chip switch 800 in which six 2×2 switching elements 812 (each having an interconnect bandwidth of b/2) are arranged in 3 stages to selectively couple input ports 810 and output ports 816. This selective coupling may be based on flow-control information provided by flow-control mechanism or logic 820 using an optical control path (not shown) that is separate from the electrical signal paths (which include electrical proximity communication between chips in the multi-chip switch 800) that communicate the data units. Note that the multi-chip switch 800 has a bisection bandwidth at bisecting planes 818 of b. In addition, the topology of this switch is referred to as a Clos network, whose size scales logarithmically as additional instances of switching elements 812 and stages are added to accommodate additional input ports 810 and output ports 816.

Note that multi-chip switch 800 may include fewer components or additional components. For example, multi-chip switch 800 may include memory 822, which may be configured to store a history of the flow-control information. Furthermore, two or more components may be combined into a single component, and the position of one or more components may be changed.

FIG. 9 presents a block diagram illustrating an embodiment of a multi-chip switch 900 in which switching elements 908, 912, 914 and 916, arranged in multiple stages, selectively couple I/O ports 910. Communication between switching elements 908, 912, 914 and 916 is on bidirectional links, and a bandwidth of the links increases at higher stages in the hierarchy of the multi-chip switch 900. For example, switching elements 916 each have a bandwidth of 2b/N, and switching elements 912 each have a bandwidth of b. (Note that a bisection bandwidth at bisecting plane 918 is b.) Furthermore, a configuration of the multi-chip switch 900 is based on flow-control information provided by flow-control logic 920 using an optical control path (not shown) that is separate from the electrical signal paths (which include electrical proximity communication between chips in the multi-chip switch 900) that communicate the data units. Note that the topology of this switch is sometimes referred to as a fat-tree network.

Multi-chip switch 900 may include fewer components or additional components. Furthermore, two or more components may be combined into a single component, and the position of one or more components may be changed.

As discussed previously, interconnects that include proximity communication (such as electrical proximity communication) may have significantly increased bandwidth. In particular, proximity communication offers I/O densities of several Tb/s/mm$^2$ or more, which corresponds to data rates of tens of Tb/s for a reasonable sized array of proximity connectors. This is larger than the bandwidths of most if not all existing multi-chip switches. In contrast with chips or switching elements in existing multi-chip switches (where the bandwidth of each chip or switching element is a fraction of the bisection bandwidth of the switch), components that include proximity communication may have bandwidths that are approximately equal to or larger than the bisection bandwidth of the switch. Therefore, multi-chip switches that include this technology may allow different partitioning of components in the switch, different switch architectures, and/or may allow expensive off-chip wiring (which is currently implemented using board traces, connectors and cables) to be replaced and/or eliminated.

Figure 10:
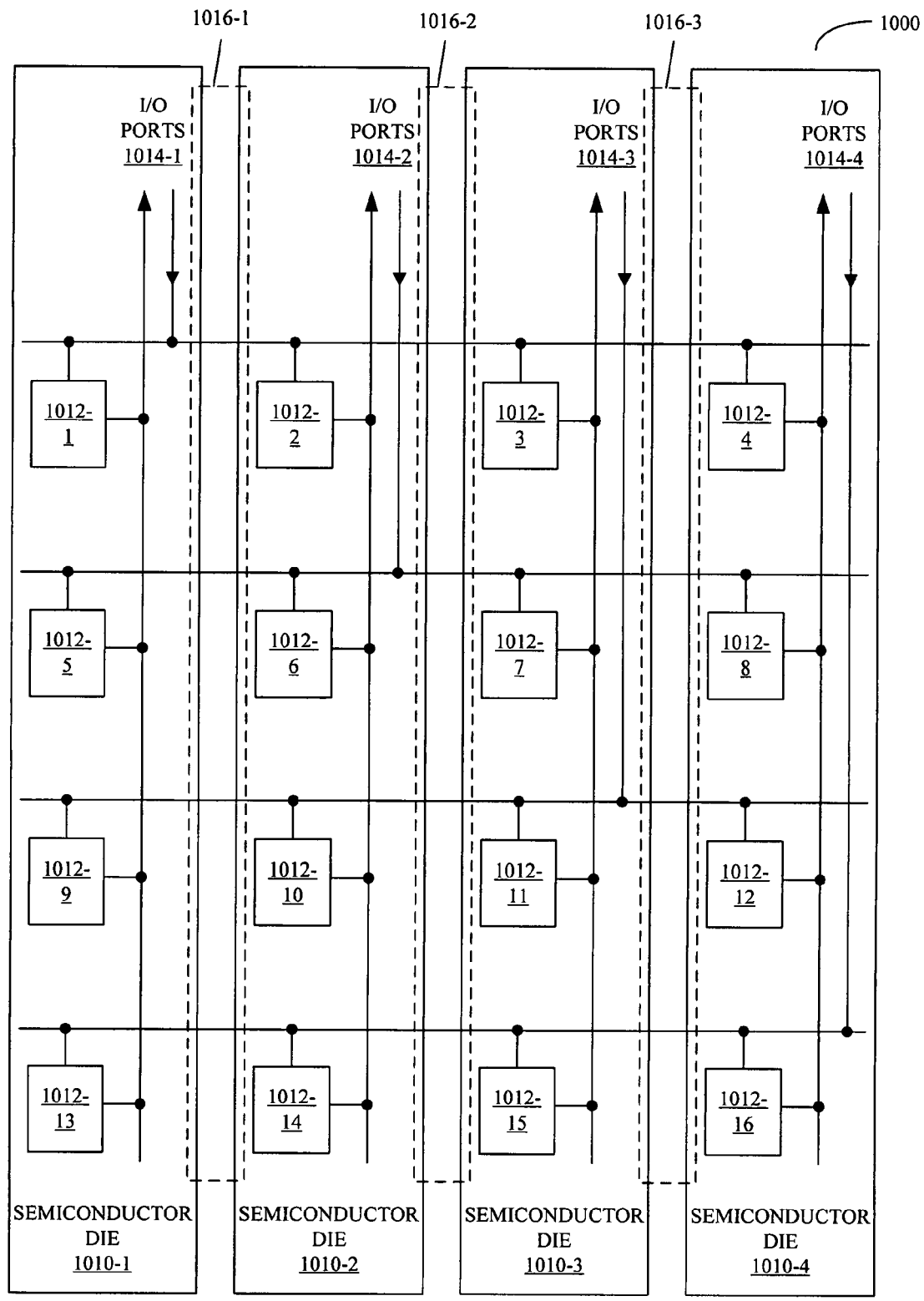
FIG. 10 is a block diagram illustrating a multi-chip switch in accordance with an embodiment of the present invention.

We now describe embodiments of a switch that includes components that communicate data units using electrical proximity communication and that communicate flow-control information using optical communication. FIG. 10 presents a block diagram illustrating an embodiment of a multi-chip switch 1000, which is sometimes referred to as a buffered crosspoint switch. Multiple semiconductor dies 1010 are coupled via bridge chips 1016 using electrical proximity communication. Note that the bandwidth of these interconnects (the bisection bandwidth) at least equals the total or full bandwidth of all of the I/O ports 1014. Thus, the semiconductor dies 1010 implement a 'flat-tree' architecture.

Each of the semiconductor dies 1010 is a switching block, and includes I/O ports 1014 and multiple buffer memories 1012 that selectively couple row and column signal lines in a 2-dimensional array. (Such semiconductor dies 1010 are also referred to as slices.) However, note that the architecture of the semiconductor dies 1010 is not the same. In particular, input signal lines from the I/O ports 1014 are coupled to different rows in the array in each of the semiconductor dies 1010. In other embodiments, input signal lines may be coupled to more than one row in a given semiconductor die, and/or the signal lines may correspond to groups of signal lines, such as a data bus.

In an exemplary embodiment, I/O ports 1014 utilize low voltage differential signaling and the multi-chip switch 1000 implements an IEEE 802.3ae 10GbE protocol, which is also referred to as XAUI. While not shown in FIG. 10, the multi-chip switch 1000 may include flow-control logic, which provides flow-control information to the buffer memories 1012 using an optical control path (not shown). Thus, buffer memory may be reserved or allocated based on the flow-control information.

Multi-chip switch 1000, as well as the embodiments of the multi-chips switches illustrated in FIGS. 11-15, may include fewer components or additional components. Furthermore, two or more components may be combined into a single component, and the position of one or more components may be changed. In some embodiments, the semiconductor dies 1010 are configured in vector topography other than a linear array, such as a ring topography.

Figure 11:
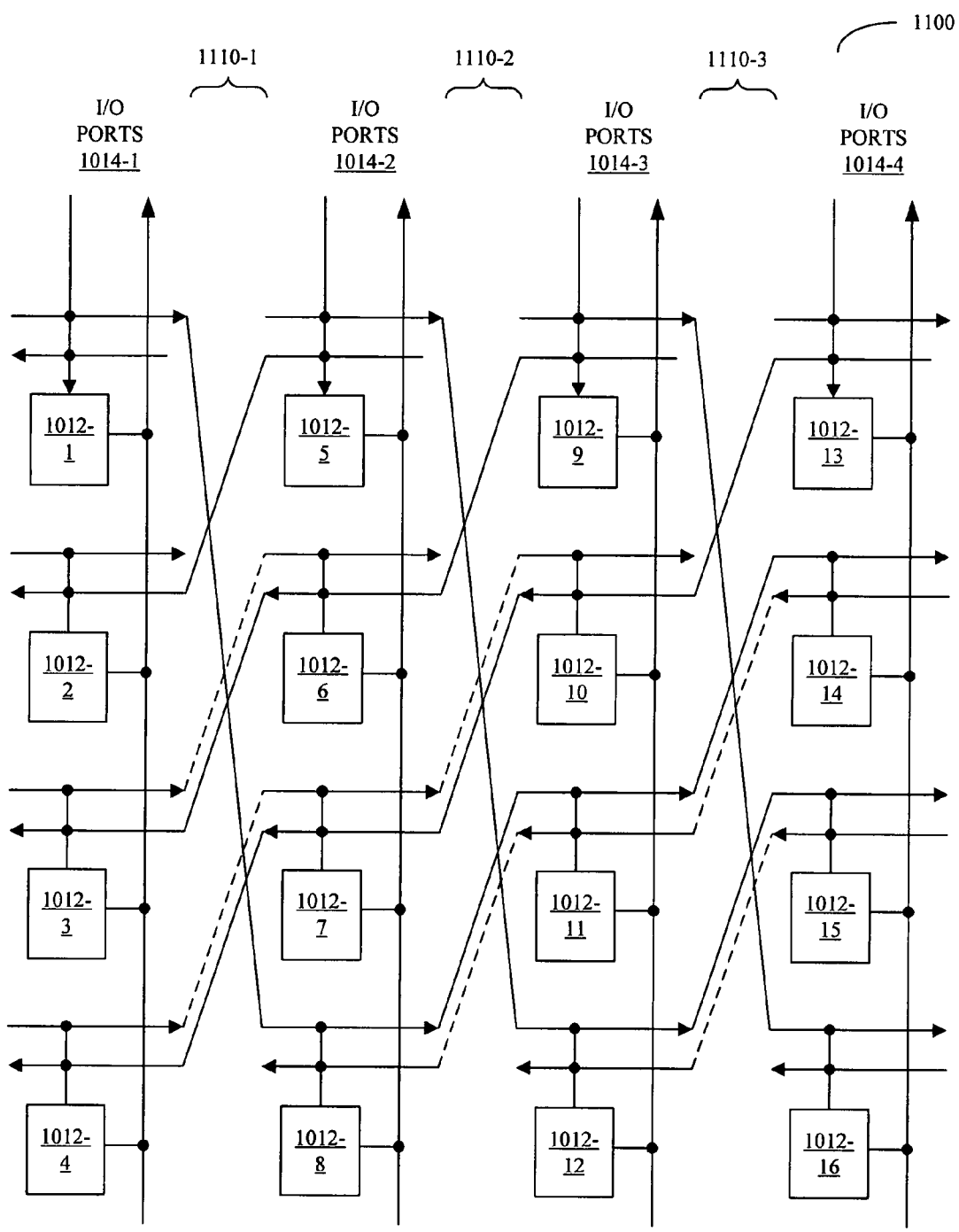
FIG. 11 is a block diagram illustrating a multi-chip switch in accordance with an embodiment of the present invention.

As noted above in the discussion of the multi-chip switch 1000, the architecture of the semiconductor dies 1010 or switching blocks is not the same. FIG. 11 presents a block diagram illustrating an embodiment of a multi-chip switch 1100 (which is sometimes referred to as a buffered crossbar) that addresses this issue. (For clarity, the semiconductor-die and bridge-chip boundaries are not shown in the multi-chip switch 1100.) In particular, each of the switching blocks has a common architecture in which an input signal line from each of the I/O ports 1014 is coupled to a first one of the buffer memories 1012, and the buffer memories 1012 selectively couple row and column signal lines in the array.

Note that the use of unidirectional row signal lines in the multi-chip switch 1100 results in redundancy in interconnects 1110. To address this issue, some of the signal lines are removed from the interconnects 1110 and others (shown as dashed lines) are not used. Furthermore, in some embodiments the routing of the signal lines in the interconnects 1110 may be implemented in the semiconductor dies or in the bridge chips, and/or the redundancy in the interconnects may be addressed using bidirectional signal lines.

Each of the buffer memories 1012 in the semiconductor dies in the multi-chip switch 1100 is associated with a separate clock domain. The corresponding clock signals may be generated locally (in each of the semiconductor dies), externally by a circuit coupled to the I/O ports 1014, or separate clock signals may be used on each direction of the row signal lines. If this technique is used, the buffer memories 1012 may each include two buffers, one for each row-signal-line direction.

Figure 12:
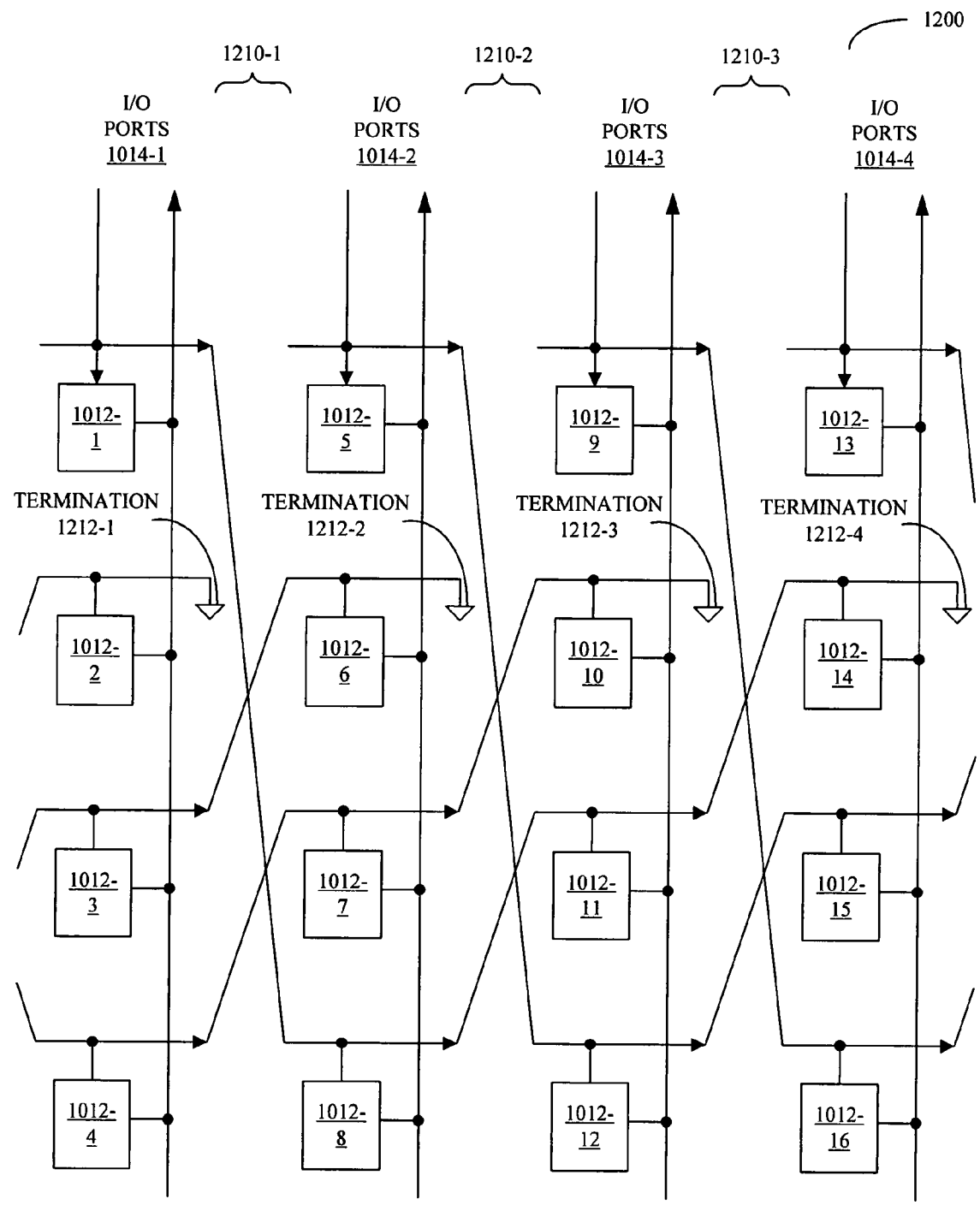
FIG. 12 is a block diagram illustrating a multi-chip switch in accordance with an embodiment of the present invention.

FIG. 12 presents a block diagram illustrating an embodiment of a multi-chip switch 1200 (which is also sometimes referred to as a buffered crossbar) which corresponds to a ring topology. Once again, for clarity the semiconductor-die and bridge-chip boundaries are not shown in the multi-chip switch 1200. Also note that the signal lines in interconnects 1210 have fewer data paths than in the multi-chip switch 1100 (FIG. 11) because data units can be communicated using unidirectional signal lines and still wrap around the ring array. After one rotation through the array, the signal lines end at terminations 1212, which implement data sinks. Furthermore, in some embodiments the routing of the signal lines in the interconnects 1210 is implemented in the semiconductor dies or in the bridge chips, and/or bidirectional signal lines are used.

Note that the size of the buffer memories 1012 in the multi-chip switch 1200, as well as in the multi-chip switch 1000 (FIG. 10) and the multi-chip switch 1100 (FIG. 11), is at least in part a function of the length and the associated delays in the signal lines between the buffer memories 1012 and the I/O ports 1014. In essence, these delays determine a stability of a data control loop because the buffer memories 1012 send flow control signals to the I/O ports 1014 based on a current state of the buffer memories 1012 (i.e., whether the buffer memories 1012 are full or not) and/or based on flow-control information received from flow-control logic (not shown) in these switches. Therefore, larger latency or delay in the signal lines may lead to larger buffer memories 1012.

Figure 13:
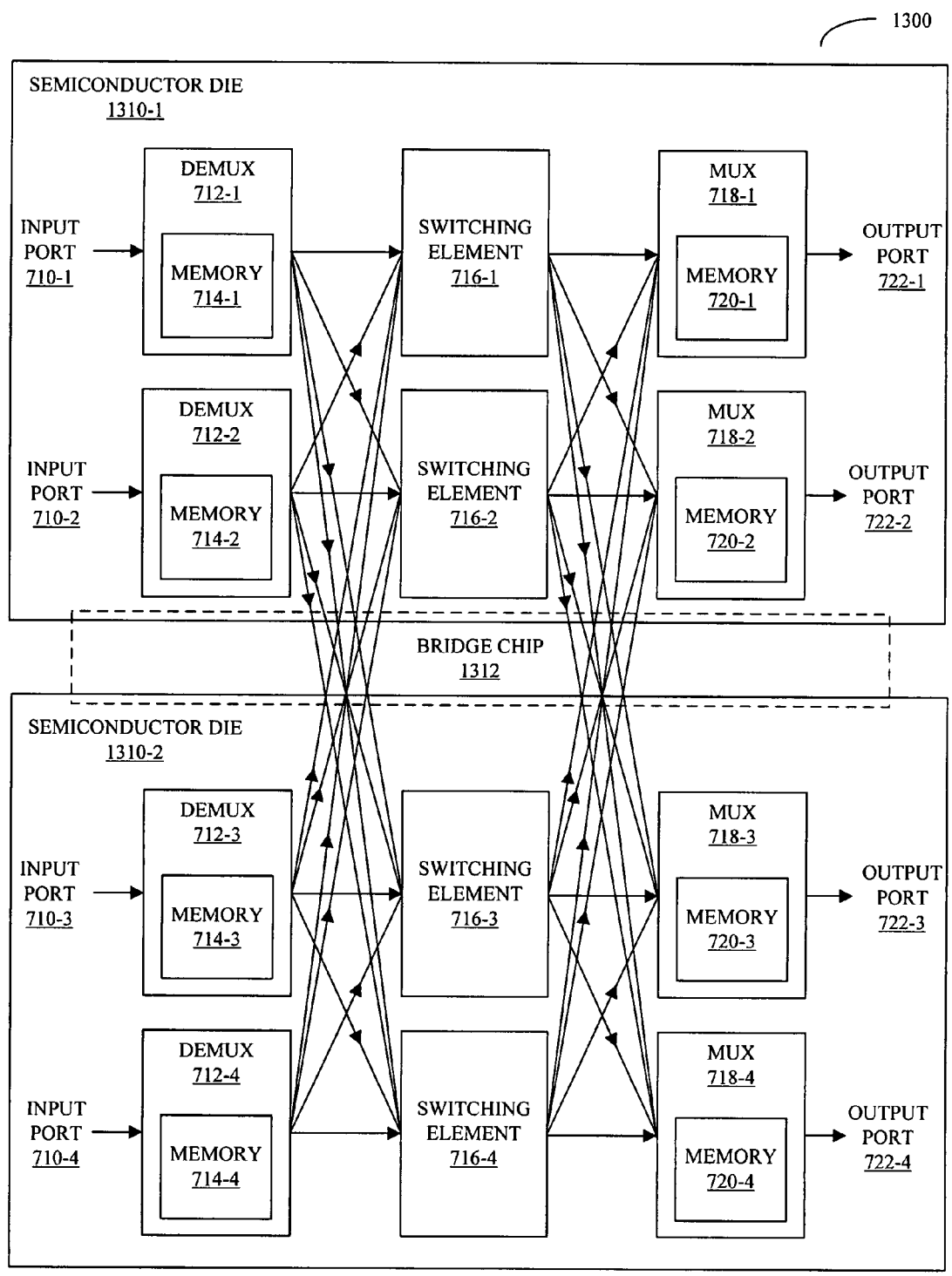
FIG. 13 is a block diagram illustrating a multi-chip switch in accordance with an embodiment of the present invention.
Figure 14:
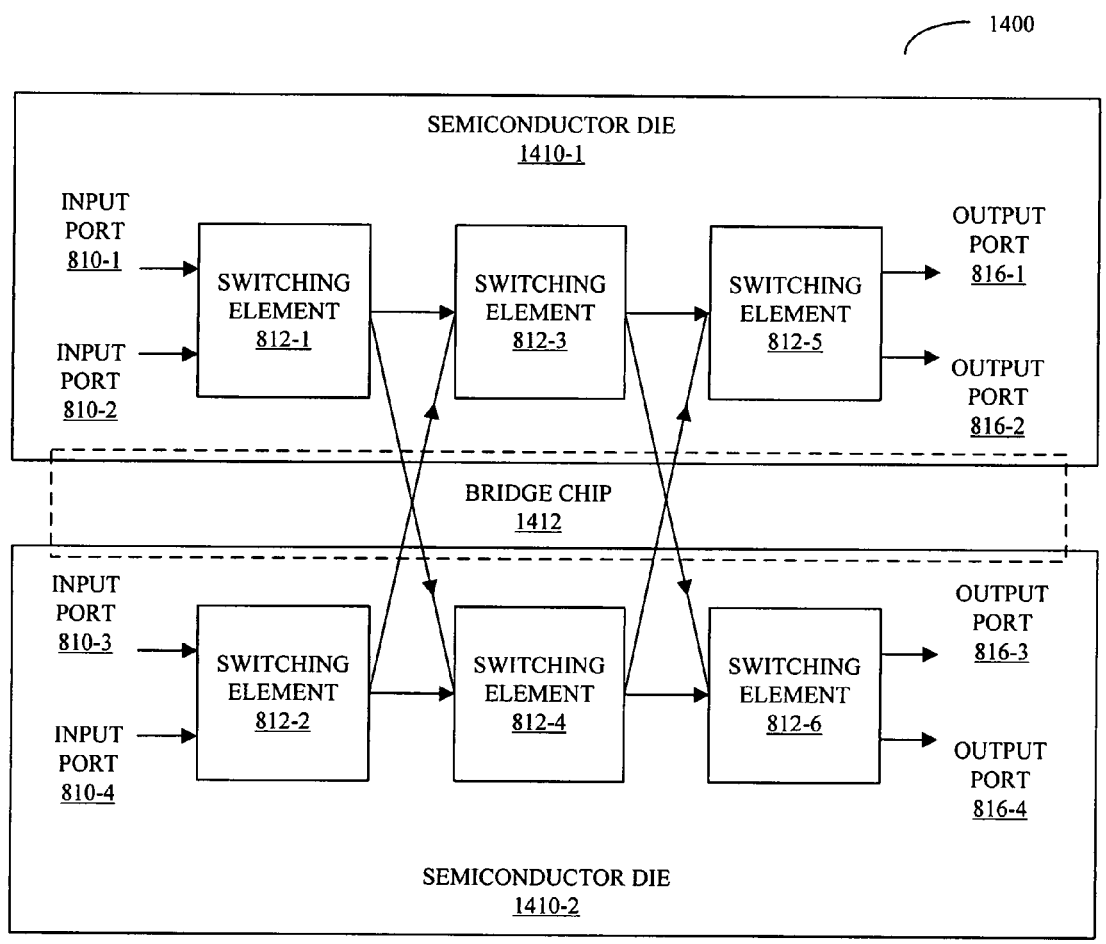
FIG. 14 is a block diagram illustrating a multi-chip switch in accordance with an embodiment of the present invention.
Figure 15:
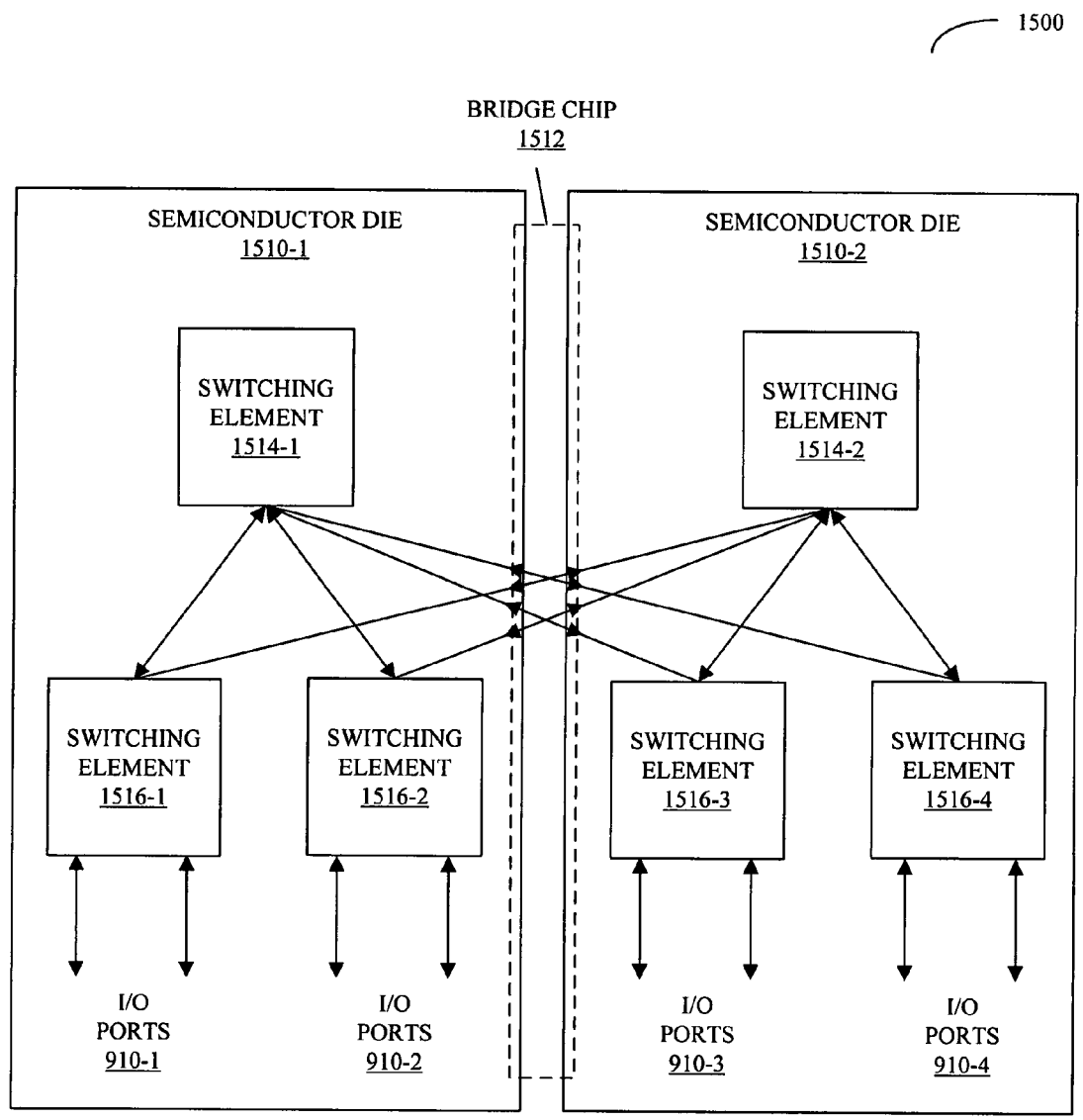
FIG. 15 is a block diagram illustrating a multi-chip switch in accordance with an embodiment of the present invention.

FIGS. 13-15 illustrate additional multi-chip switches. FIG. 13 presents a block diagram illustrating an embodiment of a multi-chip switch 1300 that corresponds to the multi-chip switch 700 (FIG. 7). Bridge chip 1312 couples two semiconductor dies 1310 that have a common architecture to implement a 4 I/O port switch that has four 4×4 switching elements 716. As in the previous embodiments, the semiconductor dies 1310 communicate with each other using electrical proximity communication, and the switching elements 716 are configured based on flow-control information that is communicated from flow-control logic (not shown) via an optical control path (not shown). Thus, the bisection bandwidth (across the bridge chip 1312) equals the full bandwidth of the multi-chip switch 1300.

FIG. 14 presents a block diagram illustrating an embodiment of a multi-chip switch 1400 that corresponds to an embodiment of the multi-switch 800 (FIG. 8), i.e., it implements a Clos network. Once again, bridge chip 1412 couples two semiconductor dies 1410 that have a common architecture to implement a 4 I/O port switch that has six 2×2 switching elements 812. As in the previous embodiments, the semiconductor dies 1410 communicate with each other using electrical proximity communication and the switching elements 812 are configured based on flow-control information that is communicated from flow-control logic (not shown) via an optical control path (not shown). Thus, the bisection bandwidth (across the bridge chip 1412) equals the full bandwidth of the multi-chip switch 1400. Note that for larger switches, the use of the Clos network reduces the number of crosspoints. Thus, the multi-chip switch 1400 includes fewer crosspoints that the multi-chip switch 1000 (FIG. 10).

Note that the topology of the multi-chip switch 1400 may be divided or sliced differently among the constituent semiconductor dies 1410. For example, instead of a horizontal division a vertical division may be used, resulting in a number of slices that each include a switching stage. However, these slices are not identical. For a switch having K stages, there are 3 types of slices, with an input slice, K-2 middle slices, and an output slice. In addition, the multi-chip switch 1400 may be divided or sliced both horizontally and vertically.

FIG. 15 presents a block diagram illustrating an embodiment of a multi-chip switch 1500 that corresponds to an embodiment of the multi-switch 900 (FIG. 9), i.e., it implements a fat-tree network. Once again, bridge chip 1512 couples two semiconductor dies 1510 that have a common architecture to implement a 8 I/O port switch that has six 2×2 switching elements 1514 and 1516. As in the previous embodiments, the semiconductor dies 1510 communicate with each other using electrical proximity communication and the switching elements 514 and 1516 are configured based on flow-control information that is communicated from flow-control logic (not shown) via an optical control path (not shown). Thus, the bisection bandwidth (across the bridge chip 1512) equals the full bandwidth of the multi-chip switch 1500. Furthermore, as in the multi-chip switch 1400 (FIG. 14), note that the use of the fat-tree network reduces the number of crosspoints, i.e., the complexity of the switching elements 1514 and 1516, relative to vector multi-chip switch topologies, such as the multi-chip switch 1000 (FIG. 10).

Note that the number of switching elements 1514 in the upper row of the multi-chip switch 1500 is determined by the number of inputs per switching element 1516 in the lower row. In architectures that include more switching elements or more rows, the multi-stage switch 1500 may be divided into more slices, and therefore may include additional semiconductor dies 1510.

In each of the preceding multi-chip switches 1300 (FIG. 13), 1400 (FIG. 14) and 1500, it should be noted that more I/O ports may be aggregated into a single semiconductor die or switching block. In addition, the size of the switches may be increased by coupling in additional semiconductor dies using additional bridge chips.

Figure 16:
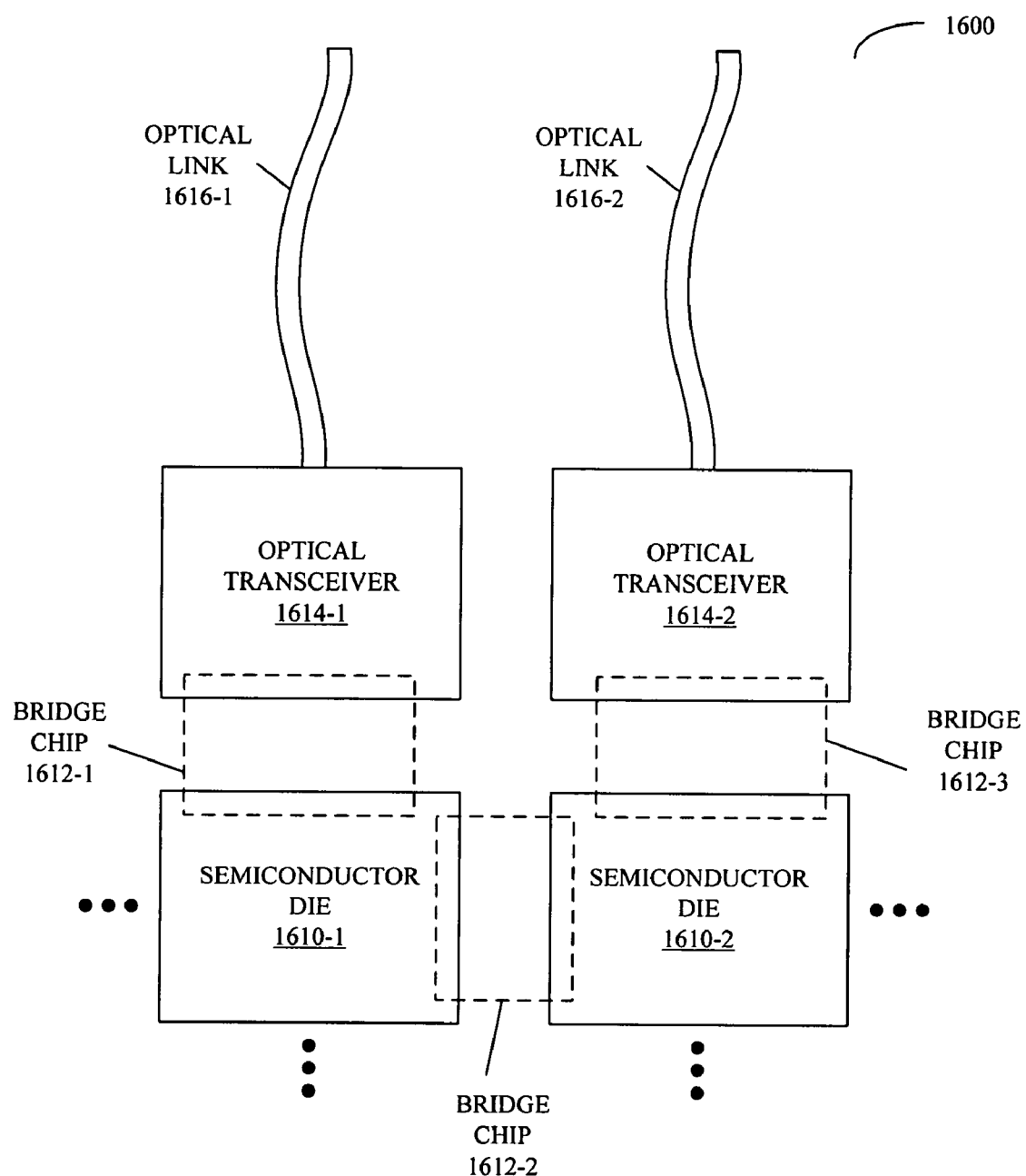
FIG. 16 is a block diagram illustrating a multi-chip module in accordance with an embodiment of the present invention.
Figure 17:
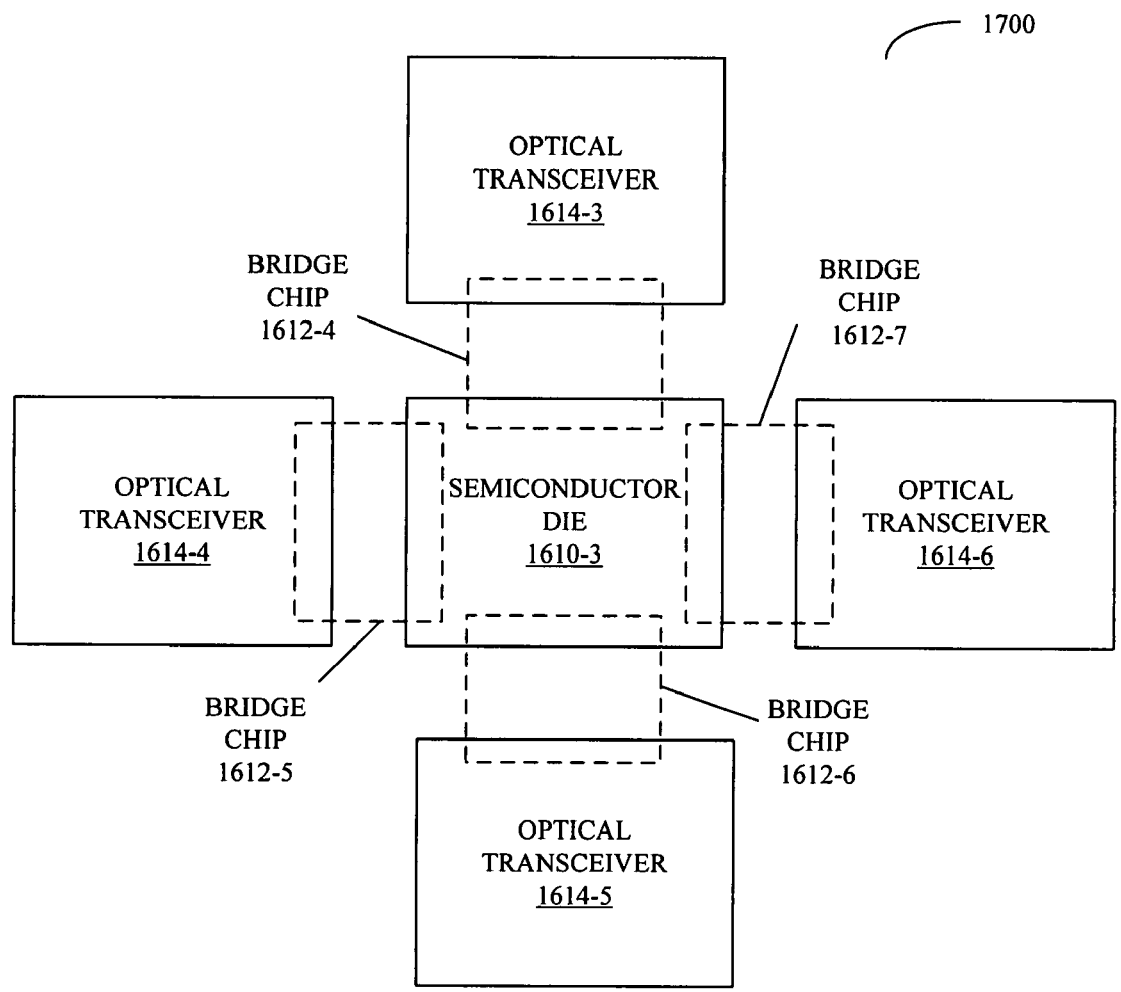
FIG. 17 is a block diagram illustrating a multi-chip module in accordance with an embodiment of the present invention.

To match the high bandwidth of a switch or, more generally, a MCM that uses electrical proximity communication, a high bandwidth I/O technology may be used to communicate data (such as data units) to and/or from the switch and/or the MCM. Fiber optic links are one such technology. FIG. 16 presents a block diagram illustrating an embodiment of a MCM 1600 that includes semiconductor dies 1610 coupled to optical transceivers 1614 using electrical proximity communication and bridge chips 1612. Note that the optical transceivers 1614 are coupled to optical links 1616, such as optical fibers. In some embodiments, these optical links 1616 may use wavelength-division multiplexing, such as dense wavelength-division multiplexing (DWDM). In some embodiments the optical transceivers 1614 and optical links 1616 are external to the MCM 1600. However, in other embodiments the optical transceivers 1614 and/or optical links 1616 are internal to the MCM 1600.

Thus, one or more of the optical transceivers 1614 may convert optical signals received using one or more of the optical links 1616 into electrical signals. These signals may be communicated within the MCM 1600 using electrical proximity communication. In addition, one or more of the optical transceivers 1614 may convert electrical signals from the MCM 1600 into optical signals that are transmitted on one or more of the optical links 1616. Note that the transceivers 1614 may include conversion elements, such as conversion elements 440 (FIG. 4B) and/or conversion element 500 (FIG. 5).

For example, a switch may receive optical signals on one of the optical links 1616 and convert the optical signals into electrical signals. These signals may be communicated through the switch using electrical proximity communication, and the route may be selected or defined by flow-control information that is communicated within the switching using optical communication. Then, the switch may convert the appropriately routed electrical signals into optical signals that are communicated using one of the optical links 1616.

As noted previously, in some embodiments a switch is implemented using a single semiconductor die that includes electrical proximity communication of the data units and optical proximity communication of the flow-control information. These switches may also convert received optical signals that correspond to the data units into electrical signals, and may convert transmitted electrical signals into optical signals. Thus, in some embodiments a MCM includes a semiconductor die and one or more optical transceivers. This shown in FIG. 17, which presents a block diagram illustrating an embodiment of a MCM 1700 that includes a semiconductor die 1610-3 coupled to optical transceivers 1614 using proximity communication and bridge chips 1612. Note that the optical transceivers 1614 are coupled to optical links (not shown).

Note that MCMs 1600 (FIG. 16) and/or 1700 may include fewer components or additional components. For example, one or more optical transceivers 1614 may be integrated onto the semiconductor dies 1610 (FIG. 16) and/or 1610-3. Furthermore, two or more components may be combined into a single component, and the position of one or more components may be changed.

In an exemplary embodiment, a multi-chip switch includes 16 semiconductor dies or switching blocks arranged in a linear array, to form a 64 Tb/s switch. Each of the semiconductor dies is coupled (via a bridge chip) to an optical transceiver that interfaces to a fiber-optic ribbon cable. These cables each have a capacity of 4 Tb/s and are coupled to line cards that may be more than 100 ft away.

In another exemplary embodiment, a Clos-network 3-stage switch (such as the multi-chip switch 1400 in FIG. 14) has 256 inputs and 256 outputs and uses 16×16 switching elements. With an I/O port bandwidth of 10 Gb/s, the aggregate throughput in this embodiment is 2.5 Tb/s. Note that each of the 16×16 switching elements includes 256 crosspoints.

If this switch implements a buffered crosspoint switch then each crosspoint buffer should be capable of holding at least two Ethernet data packets with a maximum size of 1,500 bytes (B). In this case, each 16×16 switching element may have 768 kB (256×3 kB) of memory, such as SRAM. If the switch is sliced into 3 semiconductor dies that each include one 16×16 switching element, a total of 2.25 MB (3×768 kB) of on-chip memory may be used.

Note that a 6-transistor SRAM bit measures about 1 $\mu m^2$ using 90 nm ASIC technology. If an overhead of 100% is assumed for address decoding, I/O drivers, etc., 2.25 MB or 18 Mbit of SRAM memory may occupy an area of approximately 36 $mm^2$ (2×18×10$^6$ $\mu m^2$). This is about a third of the surface area of a 10 mm×10 mm chip die.

In some embodiments, the high I/O bandwidth offered by proximity communication may be used to simplify the architecture and/or the design of a multi-chip switching fabric. For example, proximity communication may allow a monolithic design to be used. Since there is little difference between on-chip and off-chip communication with this technology, it may not be necessary to structure the implementation hierarchically to overcome limitations that are often encountered in off-chip communication with other technologies. This is illustrated in FIG. 14 in which the properties of the links that couple switching elements on the same semiconductor die are very similar to the links or interconnects that couple switching elements on different semiconductor dies. In particular, the links have similar bandwidth and/or flow-control schemes.

At the architectural level, proximity communication may allow architectural simplicity to be traded off against speed-up in the switching fabric. For example, a load-balanced switch architecture may become an attractive option because this architecture does not require a switch scheduler and, therefore, scales well to a large number of I/O ports. In this architecture, two switching elements are used in sequence (with the first one acting as a load balancer), thus doubling the switching bandwidth.

Figure 18:
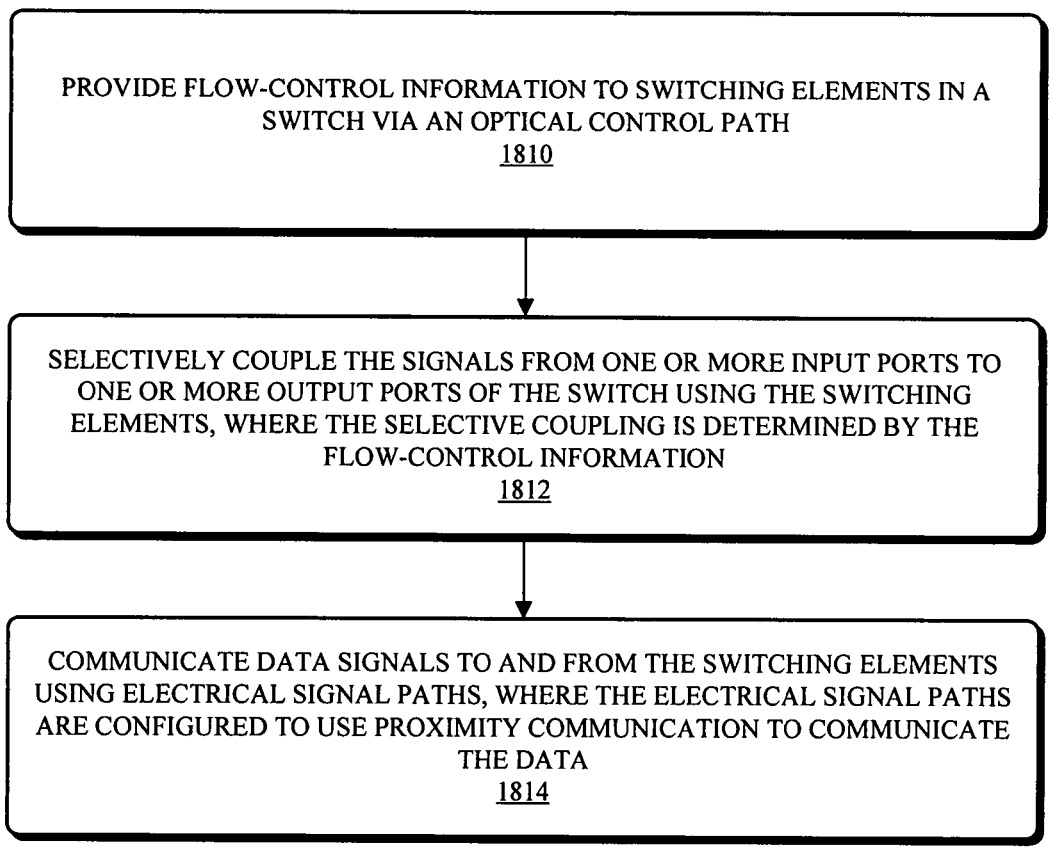
FIG. 18 is a flow chart illustrating a process for switching signals in accordance with an embodiment of the present invention.

We now describe embodiments of methods for switching signals. FIG. 18 presents a flow chart illustrating an embodiment of a process 1800 for switching signals. During this process, flow-control information is provided to switching elements in a switch via an optical control path (1810). Then, the signals are selectively coupled from one or more input ports to one or more output ports of the switch using the switching elements, where the selective coupling is determined by the flow-control information (1812). Note that the signals are communicated to and from the switching elements using electrical signal paths that are configured to use proximity communication to communicate the signals (1814).

In some embodiments of the process 1800 there may be additional or fewer operations, the order of the operations may be changed, and two or more operations may be combined into a single operation.

Figure 19:
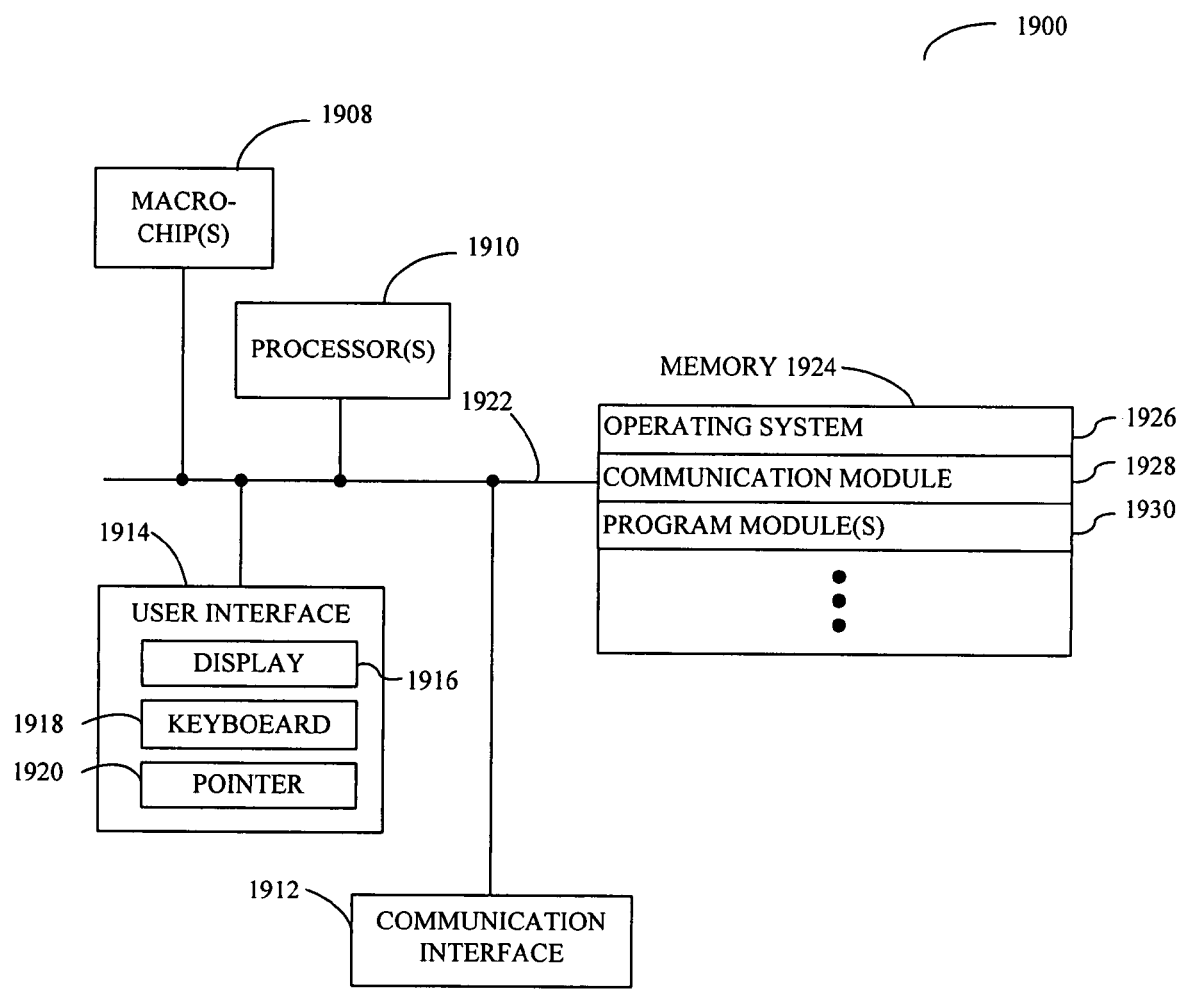
FIG. 19 is a block diagram illustrating a computer system in accordance with an embodiment of the present invention.

Note that the present invention may include systems that contain one or more MCMs and/or switches, which include components (such as one or more semiconductor dies) that communicate signals using capacitively coupled proximity connectors. For example, FIG. 19 presents a block diagram illustrating an embodiment of a computer system 1900, which includes one or more processors 1910, a communication interface 1912, a user interface 1914, and one or more signal lines 1922 coupling these components together. Note that the one or more processing units 1910 may support parallel processing and/or multi-threaded operation, the communication interface 1912 may have a persistent communication connection, and the one or more signal lines 1922 may constitute a communication bus. Moreover, the user interface 1914 may include a display 1916, a keyboard 1918, and/or a pointer, such as a mouse 1920.

Computer system 1900 may include memory 1924, which may include high speed random access memory and/or non-volatile memory. More specifically, memory 1924 may include: ROM, RAM, EPROM, EEPROM, FLASH, one or more smart cards, one or more magnetic disc storage devices, and/or one or more optical storage devices. Memory 1924 may store an operating system 1926, such as SOLARIS, LINUX, UNIX, OS X, or WINDOWS, that includes procedures (or a set of instructions) for handling various basic system services for performing hardware dependent tasks. Memory 1924 may also store procedures (or a set of instructions) in a communication module 1928. The communication procedures may be used for communicating with one or more computers and/or servers, including computers and/or servers that are remotely located with respect to the computer system 1900.

Memory 1924 may also include the one or more program modules (of sets of instructions) 1930. Instructions in the program modules 1930 in the memory 1924 may be implemented in a high-level procedural language, an object-oriented programming language, and/or in an assembly or machine language. The programming language may be compiled or interpreted, i.e., configurable or configured to be executed by the one or more processing units 1910.

Computer system 1900 may include one or more macro-chips 1908 (such as one or more switches or MCMs) that include electrical proximity communication and optical proximity communication as described in the previous embodiments. While not shown in the computer system 1900, in some embodiments the one or more macro-chips 1908 may be coupled to one or more network interface circuits (such as one or more optical transceivers).

Computer system 1900 may include fewer components or additional components, two or more components may be combined into a single component, and/or a position of one or more components may be changed. In some embodiments, the functionality of the computer system 1900 may be implemented more in hardware and less in software, or less in hardware and more in software, as is known in the art.

Although the computer system 1900 is illustrated as having a number of discrete items, FIG. 19 is intended to be a functional description of the various features that may be present in the computer system 1900 rather than as a structural schematic of the embodiments described herein. In practice, and as recognized by those of ordinary skill in the art, the functions of the computer system 1900 may be distributed over a large number of servers or computers, with various groups of the servers or computers performing particular subsets of the functions. In some embodiments, some or all of the functionality of the computer system 1900 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A switch, comprising:
    input ports configured to receive signals, wherein the signals include data;
    output ports configured to output the signals;
    switching elements, wherein a given switching element in the switching elements is coupled to a given input port in the input ports through a first electrical signal path and is coupled to a given output port in the output ports through a second electrical signal path, and wherein a given electrical signal path, which can be either the first electrical signal path or the second electrical signal path, is configured to use proximity communication to communicate the data; and
    a flow-control mechanism configured to provide flow-control information associated with the data to the switching elements, wherein the flow-control mechanism is coupled to the switching elements through an optical control path; and
    wherein the switching elements are configured to selectively couple the input ports to the output ports based on the flow-control information.

2. The switch of claim 1, wherein the optical control path includes an optical waveguide.

3. The switch of claim 1, wherein the given electrical signal path includes a first semiconductor die and a second semiconductor die, and wherein proximity connectors proximate to a first surface of the first semiconductor die are coupled to proximity connectors proximate to a second surface of the second semiconductor die.

4. The switch of claim 3, wherein the proximity connectors on the first semiconductor die are capacitively coupled to proximity connectors on the second semiconductor die.

5. The switch of claim 3, wherein the proximity connectors on the first semiconductor die are coupled to proximity connectors on the second semiconductor die via a bridge component.

6. The switch of claim 3, wherein the first surface and the second surface face each other.

7. The switch of claim 3, wherein the first semiconductor die and the second semiconductor die are included in a macro-chip, and wherein the macro-chip includes multiple semiconductor dies that communicate the data using proximity communication.

8. The switch of claim 1, wherein the data includes data packets.

9. The switch of claim 8, wherein the flow-control information is based on addresses in the data packets.

10. The switch of claim 1, wherein the switch is configured to configure the switching elements prior to routing the data through the switching elements.

11. The switch of claim 1, wherein the flow-control mechanism is configured to determine the flow-control information based on feedback from the switching elements;
    wherein the feedback is in response to a proposed routing of the data; and
    wherein the feedback is communicated to the flow-control mechanism via the optical control path.

12. The switch of claim 1, wherein the selective coupling in the given switching element is further based on local flow-control information determined in the given switching element, and wherein the local flow-control information is determined based on communication between the given switching element and adjacent switching elements in the switch.

13. The switch of claim 12, wherein the given switching element is configured to convert first optical signals corresponding to the flow-control information into first electrical signals to determine the local flow-control information, and wherein the given switching element is configured to convert second electrical signals corresponding to the local flow-control information into second optical signals and to communicate the second optical signals to other switching elements via the optical control path.

14. The switch of claim 1, further comprising memory, wherein the memory is configured to store a history of the flow-control information.

15. The switch of claim 1, wherein the optical control path is configured to communicate the flow-control information using multiple sub-channels.

16. The switch of claim 15, wherein the sub-channels are encoded using time-division multiple access, frequency-division multiple access, or code-division multiple access.

17. The switch of claim 15, wherein the communication of the flow-control information uses wavelength-division multiplexing.

18. The switch of claim 1, further comprising:
 a first conversion element configured to convert first optical signals corresponding to the received signals into electrical signals prior to coupling to the switching elements; and
 a second conversion element configured to convert the electrical signals into second optical signals prior to coupling to the output ports.

19. A computer system, comprising:
 a processor;
 memory; and
 a switch, wherein the switch includes:
  input ports configured to receive signals, wherein the signals include data;
  output ports configured to output the signals;
  switching elements, wherein a given switching element in the switching elements is coupled to a given input port in the input ports through a first electrical signal path and is coupled to a given output port in the output ports through a second electrical signal path, and wherein a given electrical signal path, which can be either the first electrical signal path or the second electrical signal path, is configured to use proximity communication to communicate the data; and
  a flow-control mechanism configured to provide flow-control information associated with the data to the switching elements, wherein the flow-control mechanism is coupled to the switching elements through an optical control path; and
 wherein the switching elements are configured to selectively couple the input ports to the output ports based on the flow-control information.

20. A method for switching signals, comprising:
 providing flow-control information to switching elements in a switch via an optical control path;
 selectively coupling the signals from one or more input ports to one or more output ports of the switch using the switching elements, wherein the selective coupling is determined by the flow-control information; and
 communicating the signals to and from the switching elements using electrical signal paths, wherein the electrical signal paths are configured to use proximity communication to communicate the signals.

* * * * *